United States Patent
Cai et al.

(10) Patent No.: US 11,164,881 B2
(45) Date of Patent: Nov. 2, 2021

(54) TRANSISTOR DEVICE, MEMORY ARRAYS, AND METHODS OF FORMING THE SAME

(71) Applicant: GLOBALFOUNDRIES Singapore Pte. Ltd., Singapore (SG)

(72) Inventors: Xinshu Cai, Singapore (SG); Shyue Seng Tan, Singapore (SG); Danny Pak-Chum Shum, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 110 days.

(21) Appl. No.: 16/127,262

(22) Filed: Sep. 11, 2018

(65) Prior Publication Data

US 2020/0083237 A1 Mar. 12, 2020

(51) Int. Cl.
  *H01L 27/11524* (2017.01)
  *H01L 29/788* (2006.01)
  *G11C 11/56* (2006.01)
  *G11C 16/04* (2006.01)

(52) U.S. Cl.
  CPC .... *H01L 27/11524* (2013.01); *G11C 11/5628* (2013.01); *G11C 16/0408* (2013.01); *G11C 16/0483* (2013.01); *H01L 29/7881* (2013.01)

(58) Field of Classification Search
  None
  See application file for complete search history.

(56) References Cited

U.S. PATENT DOCUMENTS

| | | | | |
|---|---|---|---|---|
| 6,232,634 B1 * | 5/2001 | Wu | ............... | G11C 16/0433 257/315 |
| 6,563,166 B1 * | 5/2003 | Ni | ............... | H01L 27/115 257/316 |
| 6,747,310 B2 | 6/2004 | Fan et al. | | |
| 7,978,522 B2 | 7/2011 | Kang et al. | | |
| 9,184,252 B2 * | 11/2015 | Chuang | ............. | H01L 29/66545 |
| 9,548,312 B1 * | 1/2017 | Beyer | ............. | H01L 27/11539 |
| 9,583,640 B1 * | 2/2017 | Richter | ............ | H01L 27/11539 |
| 9,679,980 B2 * | 6/2017 | Cheng | .............. | H01L 29/42328 |
| 9,711,513 B2 * | 7/2017 | Zaka | ................ | H01L 29/66825 |
| 9,947,676 B2 * | 4/2018 | Wu | ................... | H01L 29/7883 |
| 9,960,242 B2 * | 5/2018 | Wang | .............. | H01L 29/42328 |
| 10,283,512 B2 * | 5/2019 | Wu | .................. | H01L 29/66545 |
| 10,325,918 B2 * | 6/2019 | Wu | .................. | H01L 27/11531 |
| 2009/0168529 A1 * | 7/2009 | Yamada | ............ | H01L 29/7883 365/185.13 |

(Continued)

FOREIGN PATENT DOCUMENTS

WO  2017044251 A1  3/2017

*Primary Examiner* — David E Graybill
(74) *Attorney, Agent, or Firm* — Viering Jentschura & Partner mbB

(57) ABSTRACT

In a non-limiting embodiment, a memory array is provided having a transistor device. The transistor device includes transistor device first, second and third doped regions in a substrate. The transistor device further includes a first transistor device select gate over a region between the transistor device first doped region and the transistor device second doped region, and a second transistor device select gate over a region between the transistor device first doped region and the transistor device third doped region. The transistor device further includes a transistor device dielectric barrier extending between the first transistor device select gate and the second transistor device select gate. A width of the dielectric barrier compared to a width of the first transistor device select gate and/or the second transistor device select gate may have a ratio ranging from 0.33:1 to 5:1.

18 Claims, 15 Drawing Sheets

(56) References Cited

U.S. PATENT DOCUMENTS

| | | | | |
|---|---|---|---|---|
| 2013/0023114 | A1* | 1/2013 | Power | H01L 29/66825 |
| | | | | 438/585 |
| 2013/0234223 | A1* | 9/2013 | Toren | H01L 27/11568 |
| | | | | 257/316 |
| 2014/0008713 | A1* | 1/2014 | Toh | H01L 21/823425 |
| | | | | 257/321 |
| 2015/0137207 | A1* | 5/2015 | Chuang | H01L 29/517 |
| | | | | 257/316 |
| 2015/0263123 | A1* | 9/2015 | Cheng | H01L 27/11521 |
| | | | | 257/319 |
| 2015/0364478 | A1* | 12/2015 | Roy | H01L 29/40117 |
| | | | | 257/326 |
| 2016/0005749 | A1* | 1/2016 | Li | G11C 11/223 |
| | | | | 257/295 |
| 2016/0155813 | A1* | 6/2016 | Roy | H01L 29/792 |
| | | | | 257/314 |
| 2017/0047336 | A1* | 2/2017 | Zaka | H01L 27/11524 |
| 2017/0110195 | A1* | 4/2017 | Chen | G11C 16/14 |
| 2017/0278937 | A1* | 9/2017 | Chen | H01L 29/42344 |
| 2017/0301683 | A1* | 10/2017 | Chen | H01L 29/42328 |
| 2017/0330949 | A1* | 11/2017 | Wang | H01L 29/40114 |
| 2018/0012898 | A1* | 1/2018 | Wu | H01L 29/7883 |
| 2018/0108669 | A1* | 4/2018 | Zhu | H01L 27/1157 |
| 2018/0151581 | A1* | 5/2018 | Wu | H01L 27/11568 |
| 2018/0151582 | A1* | 5/2018 | Wu | H01L 27/11539 |
| 2018/0151707 | A1* | 5/2018 | Wu | H01L 27/11521 |
| 2018/0219018 | A1* | 8/2018 | Wu | H01L 29/42344 |
| 2018/0286877 | A1* | 10/2018 | Ma | H01L 27/11529 |
| 2019/0035799 | A1* | 1/2019 | Shu | H01L 21/8249 |
| 2019/0164981 | A1* | 5/2019 | Chen | G11C 11/5621 |
| 2020/0083237 | A1* | 3/2020 | Cai | G11C 16/0408 |

* cited by examiner

TRANSISTOR DEVICE, MEMORY ARRAYS, AND METHODS OF FORMING THE SAME

TECHNICAL FIELD

The present disclosure relates generally to transistor devices, memory arrays, and methods of forming the same.

BACKGROUND

Non-volatile memory (NVM) devices are able to retain stored data even when the power supply is interrupted. Non-volatile memory devices include flash devices which can be programmed using electrical signals. A NVM cell, for example, includes a memory transistor and a select transistor in series. The memory transistor stores data programmed into the memory cell, while the select transistor selects the memory cell to be programmed or erased. The memory cells are interconnected to form a memory array. For example, the various terminals of a memory cell are coupled to metal lines in interconnect levels. The connections to the metal lines may be referred to as straps or pick-ups.

In the memory array, power-on-reset cells are used as source line pull down cells. Using such power-on-reset cells as source line pull down cells presents limitations such as a smaller drive current. Unless more source line pull down cells are used inside the memory array, the smaller drive current impacts the read margin of the non-volatile memory. On the other hand, introducing more source line pull down cells to increase the drive current is not ideal as this will consume more area of the memory array. Further, the power-on-reset cells pose other concerns, such as disturbing the programming operations of the memory cell.

SUMMARY

Embodiments generally relate to semiconductor device and method for forming a semiconductor device. In some embodiments, a memory array and method for forming the memory array are provided. The memory array includes a transistor device and a memory device. Embodiments may relate to the transistor device. The transistor device includes transistor device first, second and third transistor doped regions in a substrate. The transistor device further includes a first transistor device select gate over a region between the transistor device first doped region and the transistor device second doped region, and a second transistor device select gate over a region between the transistor device first doped region and the transistor device third doped region. The transistor device includes a transistor device dielectric barrier extending between the first transistor device select gate and the second transistor device select gate. A width of the dielectric barrier compared to a width of the first transistor device select gate and/or the second transistor device select gate has a ratio ranging from 0.33:1 to 5:1.

As for the memory device, it may include a first memory device select gate and a second memory device select gate. The memory device further includes a memory device dielectric layer at least partially extending from the first memory device select gate to the second memory device select gate.

The semiconductor devices within the memory arrays may be used as source line (SL) pull down devices capable of having a much larger drive current to efficiently pull down a SL voltage during a read operation. Such devices utilize less area of the memory array, but increase the drive current as compared to conventional devices used in memory arrays.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Figure 1:
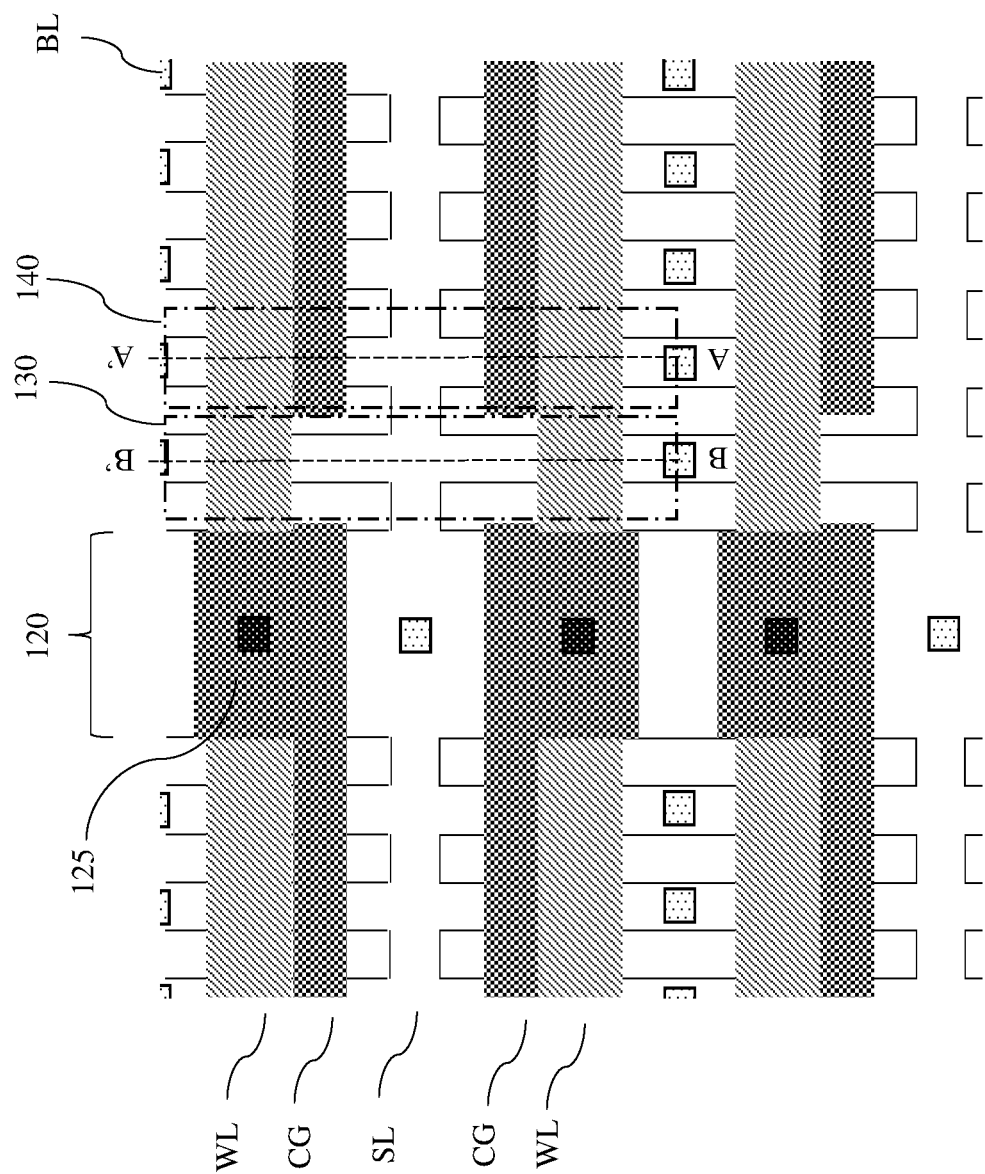
FIG. 1 shows a top view of an embodiment of a memory array.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments generally relate to semiconductor devices. More particularly, some embodiments relate to memory devices, such as non-volatile memory (NVM) devices. Such memory devices, for example, may be incorporated into standalone memory devices, such as Universal Serial Bus (USB) or other types of portable storage units, or integrated circuits (ICs), such as microcontrollers or system on chips (SoCs). The devices or ICs may be incorporated into or used with, for example, consumer electronic products, or related to other types of devices. Embodiments may relate to a memory array with optimized source line pull down devices.

FIG. 1 shows a simplified top view of an embodiment of a memory array 100. The top view, for example, shows a portion of the memory array. The memory array includes a plurality of memory devices arranged in a memory region of a substrate. The plurality of memory devices may be arranged in first and second directions. The first direction, for example, may include rows of the array while the second direction may include columns of the array. Other configurations of the memory devices in the memory array may also be useful. In one embodiment, a memory device includes a pair of memory cells of the memory array. For example, the memory device includes first and second memory cells. It is understood that numerous memory cells may be arranged in columns and rows to form the memory array. Further, the array may be configured to have sub-arrays or sectors.

The memory devices, for example, may be interconnected in the first direction by word lines (WLs), control gate lines (CGLs), erase gate lines (EGL) (not shown), and source lines (SLs) to form rows of memory devices and in the second direction by bit lines (BL) to form columns of the memory devices. Memory operations such as program, read and erase operations may be performed by applying appropriate voltages to the memory devices via the BLs, CGLs, WLs, EGLs and SLs.

In one embodiment, the memory array includes a strap region or structure 120. The strap region, in one embodiment, serves as pick up structure for the terminals of the memory cells. For example, the strap region 120 includes a CG pick up strap 125. The strap region, for example, couples or interconnects the terminals of the memory devices to metal lines in interconnect levels of an interlevel dielectric (ILD) layer. It is understood that there may be more than one strap region per row of the memory array. The number of strap regions in an array, for example, may depend on design requirements, such as performance and length of a row.

In one embodiment, the memory array includes one or more transistor devices. A transistor device of the memory array, in one embodiment, serves as a SL pull down device for the memory devices of the memory array. In one embodiment, a transistor device 130 serving as a SL pull down device may be arranged in a column which is adjacent to the strap region 120 of the memory array. For example, the transistor device 130 is located in a column in between the strap region and an adjacent column containing a plurality of memory devices. For example, the transistor device 130 and a memory device 140 are arranged in adjacent columns of the memory array. The memory device 140 may be coupled to the transistor device 130 via a SL. The transistor device 130, for example, serves to pull down the SL voltage of the memory device 140.

Figure 2:
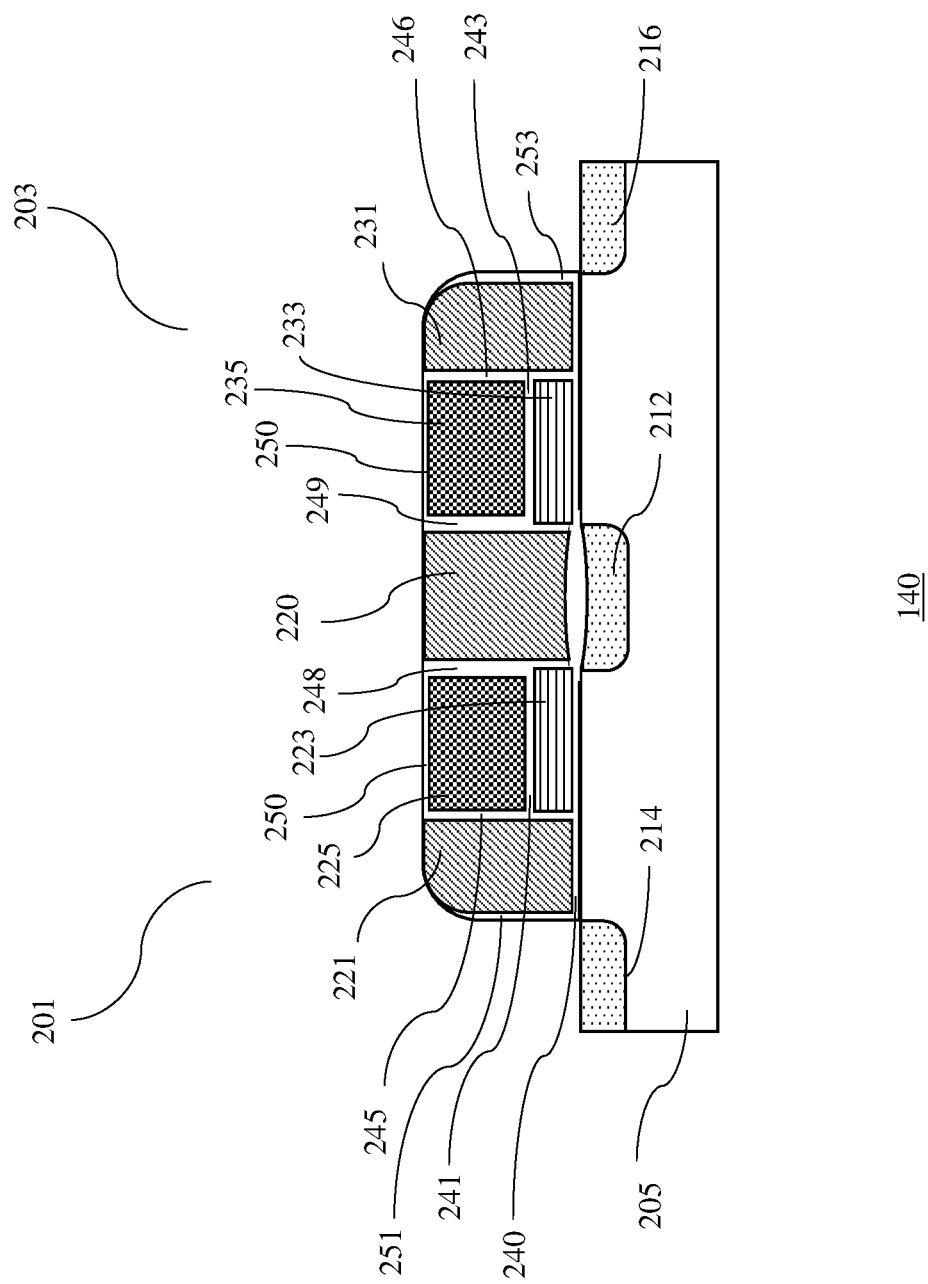
FIG. 2 shows a simplified cross-sectional view of an embodiment of a memory device.

FIG. 2 shows a simplified cross-sectional view of an embodiment of a memory device 140 along A-A' in the first direction. For example, the memory device is arranged in a first column of the memory array.

The memory device, for example, includes a pair of memory cells of the memory array. As shown, the memory device includes first and second memory cells 201 and 203 on a substrate 205. For example, the first and second memory cells are part of the same column of memory cells. The substrate may be a semiconductor substrate, such as a silicon substrate. Other types of semiconductor substrates may also be used. For example, the substrate may be silicon germanium or silicon-on-insulator (SOI) or doped dopants. The substrate, for example, may be prepared with a memory region containing memory cells of the device. Providing a substrate prepared with other types of regions (not shown) may also be useful. For example, the substrate may include a logic region for support or other types of logic circuitry. The substrate may also include regions for other types of circuitry, depending on the type of device or IC. For example, the logic region may include sub-regions for high voltage (HV), medium voltage (MV) and low voltage (LV) devices.

In some embodiments, the device may be a first polarity type device (e.g., an n-type device or n-channel device), and the memory region may include a doped well with dopants of a second polarity type (e.g., p-type dopants). The doped well may be lightly or intermediately doped. The doped well may serve as the body of transistors of the memory cells in the memory region. The doped well may be a common doped well in the memory region for the memory cells. The second polarity type doped well serves as a well for the first polarity type device. In one embodiment, the second polarity type may be p-type. For example, the p-type doped well serves as a well for an n-type memory cell. Conversely, providing an n-type doped well may also be useful. For example, an n-type doped well serves as a well for p-type memory cells. P-type dopants can include boron (B), aluminum (Al), indium (In) or a combination thereof while n-type dopants can include phosphorus (P), arsenic (As), antimony (Sb) or a combination thereof.

In some embodiments, the substrate may include isolation regions (not shown) to isolate active device regions from other active device regions. The isolation regions, for example, may be shallow trench isolation (STI) regions. Other types of isolation regions are also useful. For example, isolation regions may be used to isolate columns of memory cells. Other configurations of isolation regions may also be useful.

In one embodiment, the memory device 140 includes a memory device first doped region 212, a memory device second doped region 214 and a memory device third doped region 216 in the substrate. For example, the memory device first doped region 212 may be a source region of the memory device while the memory device second and third doped regions 214, 216 may be drain regions of the memory device. Other configurations may also be useful. For example, the memory device first doped region 212 may be a drain region of the memory device while the memory device second and third doped regions 214, 216 may be the source regions of the memory device.

In one embodiment, the memory device first, second and third doped regions may be doped with dopants of a first polarity type. For example, the first polarity type may be n-type dopants. Other configuration for the dopants may also be useful. For example, the first polarity type may be p-type dopants. Alternatively, the memory device first, second and third doped regions may be doped with dopants of a second polarity type. The first, second and third doped regions, for example, may be heavily doped regions. The dopant concentration of the first, second and third doped regions, for example, may range from $1 \times 10^{19}$ cm$^{-3}$ independently to $1 \times 10^{20}$ cm$^{-3}$. Other dopant concentrations may also be useful. The first, second and third doped regions may have the same or different dopant concentrations.

In one embodiment, the memory device first doped region 212 may be common, i.e. shared, to the first and second memory cells 201 and 203. For example, the first and second memory cells of the memory cell pair may share the same source region 212. In one embodiment, the memory device second and third doped regions may be common doped regions with adjacent memory devices in the same column. For example, the gates of adjacent memory cells of adjacent memory devices in a column share the same drain regions. Other configurations of the memory cell devices may also be useful.

The memory device 140 includes a memory device erase gate 220 provided over the memory device first doped region 212. The memory device erase gate 220 may be a common erase gate, i.e. shared, for the first and second memory cells 201 and 203 of the memory device. In one embodiment, the first memory cell 201 includes a first memory device select gate 221 disposed over a region between the memory device first doped region 212 and the memory device second doped region 214. The first memory cell 201 further includes a first storage gate disposed between the memory device erase gate 220 and the first memory device select gate 221. In one embodiment, the first storage gate includes a first memory device floating gate 223 and a first memory device control gate 225. As shown, the first memory device floating gate 223 is disposed between the memory device erase gate 220 and the first memory device select gate 221. The first memory device control gate 225 may be disposed over the first memory device floating gate 223.

As for the second memory cell 203, it includes a second memory device select gate 231 disposed over a region between the memory device first doped region 212 and the memory device third doped region 216. The second memory cell 203 includes a second storage gate disposed between the memory device erase gate 220 and the second memory device select gate 231. The second storage gate may include a second memory device floating gate 233 and a second memory device control gate 235. The second memory device floating gate 233, as shown, may be disposed between the memory device erase gate 220 and the second memory device select gate 231. The second memory device control gate 235 may be disposed over the second memory device floating gate 233.

The different gates of the memory device, for example, may be polysilicon gates. The polysilicon gates may be doped. Other types of gates may also be useful. For example, the gates may be formed of different material. The gates may be formed by, for example, chemical vapor deposition (CVD). Other techniques for forming the gates may also be useful as known to those skilled in the art.

The first and second memory device select gates 221, 231, first and second floating gates 223, 233, and erase gate 220 of the memory device may be separated from the substrate 205 by a memory device dielectric layer 240. In one embodiment, the memory device dielectric layer 240 extends between the first memory device select gate 221 and the substrate 205, between the second memory device select gate 231 and the substrate 205, between the first memory device floating gate 223 and the substrate 205, between the second memory device floating gate 233 and the substrate 205, and between the memory device erase gate 220 and the substrate 205. In other words, the memory device dielectric layer 240 may be on or over the substrate 205. The memory device select gates 221, 231, the memory device floating gates 223, 233, and the memory device erase gate 220 may be on or over the memory device dielectric layer 240. For example, the memory device dielectric layer 240 may serve as a gate dielectric, storage dielectric, insulating dielectric, or a combination thereof.

In some embodiments, the memory device dielectric layer 240 may be a single dielectric layer. Alternatively, the memory device dielectric layer 240 may be a combination of dielectric layers. In other words, the memory device dielectric layer 240 may include a plurality of sub-layers. In one embodiment, the memory device dielectric layer 240 may be an oxide layer. For example, the memory device dielectric layer 240 may be a silicon oxide layer such as a thermal silicon oxide layer formed from thermal oxidation. In other embodiments, the memory device dielectric layer may be an oxide layer formed by CVD. The memory device dielectric layer, for example, may have a thickness ranging from about 20 A to 60 A. Other types of dielectric layers or thicknesses may also be useful. For example, the memory device dielectric layer 240 may have different thicknesses for portions between the first memory device select gate and the substrate, between the second memory device select gate and the substrate, between the first memory device floating gate and the substrate, between the second memory device floating gate and the substrate, and between the memory device erase gate and the substrate.

As for the first and second memory device control gates 225, 235, they may be separated from the first and second memory device floating gates 223, 233 by first and second control gate dielectrics 241 and 243 respectively. A control gate dielectric, for example, may be a control gate dielectric stack. For example, the control gate dielectric may be a stack of dielectric layers such as silicon oxide and silicon nitride. For example, the control gate dielectric may be a silicon oxide/silicon nitride/silicon oxide (ONO) stack in a non-limiting embodiment. The thickness of the first control gate dielectric having an ONO stack, for example, may be about 50 A/50 A/50 A. The thickness of the second control gate dielectric having an ONO stack, for example, may be about 50 A/50 A/50 A. Other types of dielectric layers, such as aluminum oxide, may also be useful for isolating the memory device control gates from the memory device floating gates. Other combinations of dielectric layers and thickness for the first and second control gate dielectrics 241 and 243 may also be useful. For example, a control gate dielectric may be a single dielectric layer. A control gate dielectric having a single dielectric layer, for example, may have a thickness of about 150 A.

Side wall dielectrics may be provided to separate the memory device select gates from the storage gates. In one embodiment, a first memory device select gate sidewall dielectric 245 is disposed between the first memory device select gate dielectric 221 and the first storage gate. For example, the first memory device select gate sidewall dielectric 245 is disposed between the first memory device select gate 221 and the first memory device floating gate 223 and first memory device control gate 225. Similarly, a second memory device select gate sidewall dielectric 246 is disposed between the second memory device select gate dielectric 231 and the second storage gate. For example, the second memory device select gate sidewall dielectric is disposed between the second memory device select gate 231 and the second memory device floating gate 233 and second memory device control gate 235. The first and second memory device select gate sidewall dielectrics 245 and 246 may be single dielectric layers such as silicon oxide layers. Alternatively, the first and second memory device select gate sidewall dielectrics may be stack of dielectric layers such as a combination of oxide and nitride layers. The first and second memory device select gate sidewall dielectrics may each have a thickness of about 200 A to 300 A.

In one embodiment, a first memory device erase gate sidewall dielectric 248 may be disposed between the first storage gate and the memory device erase gate 220. Similarly, a second memory device erase gate sidewall dielectric 249 may be disposed between the second storage gate and the memory device erase gate 220.

For example, the first and second memory device erase gate sidewall dielectrics 248, 249 may each be a dielectric stack which includes a plurality of dielectric layers such as a combination of oxide and nitride layers. Providing first and second memory device erase gate sidewall dielectrics 248, 249 with a single dielectric layer may also be useful. The first and second memory device erase gate sidewall dielectrics 248, 249, for example, may each have a thickness ranging from about 200 A to 300 A.

In some embodiments, a hard mask layer 250 may be disposed over the first memory device control gate 225 and the second memory device control gate 235. The hard mask layer, for example, may be a dielectric layer, such as an aluminum oxide layer, a silicon oxide layer, a polysilicon layer, a silicon nitride layer, and combinations thereof. The hard mask, for example, may be formed by CVD in a non-limiting embodiment. Other suitable types of hard mask or dielectric materials and forming techniques may also be useful as would be recognized by those skilled in the art.

A first sidewall dielectric spacer 251 may be provided on the sidewall of the first memory device select gate 221 adjacent to the memory device second doped region 214 and a second sidewall dielectric spacer 253 may be provided on the sidewall of the second memory device select gate 231 adjacent to the memory device third doped region 216. A dielectric spacer, for example, may be a spacer stack having a first spacer dielectric layer and a second spacer dielectric layer. For example, the first spacer dielectric layer may be a silicon oxide layer and the second spacer dielectric layer may be a silicon nitride layer. To form the first and second sidewall dielectric spacers 251 and 253, a first spacer dielectric layer and a second spacer dielectric layer may be deposited, for example, by CVD and anisotropically etched, leaving the first sidewall dielectric spacer 251 on the sidewall of the first memory device select gate 221 and the second sidewall dielectric spacer 253 on the sidewall of the second memory device select gate 231. Other techniques for forming the spacer may also be useful. Other types of dielectric layers and combination of dielectric layers for the dielectric spacers may also be useful. For example, providing a sidewall dielectric spacer having a single dielectric layer such as silicon oxide or silicon nitride may also be useful.

In some embodiments, an interlevel dielectric (ILD) layer (not shown) may be disposed over the memory device 140. The ILD layer may be disposed over the memory array in the memory region of the substrate. The ILD layer, for example, may include contacts and conductive lines in a plurality of ILD or interconnect levels. For example, contacts may be disposed in contacts levels and conductive lines may be disposed in metal lines. For example, contacts may be tungsten contacts while the conductive lines may be copper conductive lines. Alternatively, the contacts and the conductive lines may be formed by copper. The contacts and metal lines of a metal level may be of the same type of conductive material or of different types of materials. The dielectric in the ILD levels, for example, may be silicon oxide. Other types of dielectric materials for the ILD levels, such as silicon nitride may also be useful.

The conductive lines may be provided in metal levels which are coupled to various terminals of the memory cells. The terminals, for example, include select gates, control gates, drains and sources regions and erase gates of the memory cells. For example, metal word lines (WLs) may be coupled to select gates, metal control gate lines (CGLs) may be coupled to control gates, metal select lines (SLs) may be coupled to source regions, metal bit lines (BLs) may be coupled to drain regions, and erase gate lines (EGLs) may be coupled to erase gates. In one embodiment, the contacts and metal lines may be coupled to the memory cell terminals in one or more strap regions.

As described, the first and second memory cells of the memory device share a common memory device first doped region 212 and the memory device erase gate 220 is a common erase gate for the first memory cell 201 and the second memory cell 203. The memory device first doped region, for example, may be coupled to a source line (SL—see FIG. 1), and the memory device erase gate may be coupled to an erase gate line (EGL). A first word line (WL$_1$) may be coupled to the first memory device select gate and a first control gate line (CGL$_1$) may be coupled to the first memory device control gate, a second word line (WL$_2$) may be coupled to the second memory device select gate and a second control gate line (CGL$_2$) may be coupled to the second memory device control gate. As for the memory device second and third doped regions, they are coupled to a common bit line (BL).

Figure 3A:
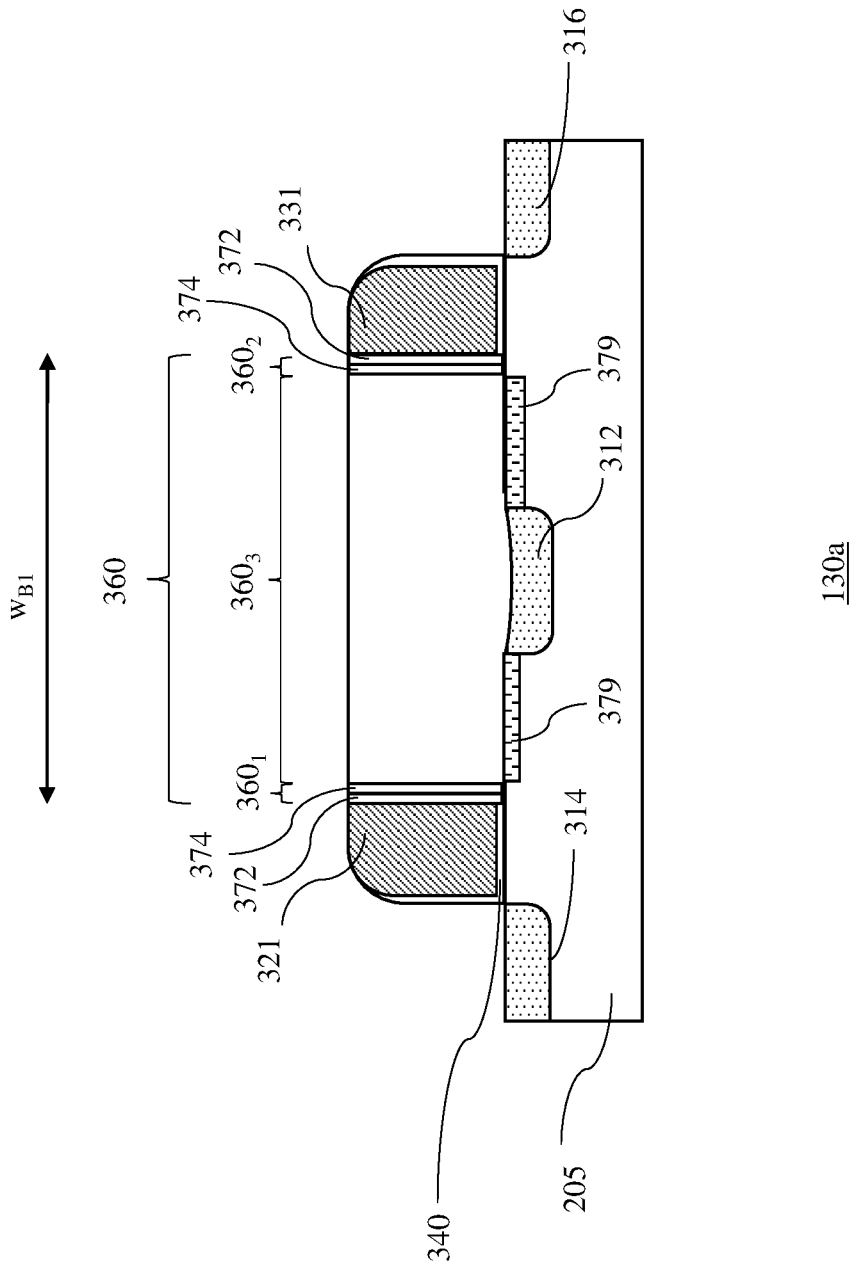
FIGS. 3A, 3BA and 3BB show simplified cross-sectional view of embodiments of a transistor device.
Figure 3B:
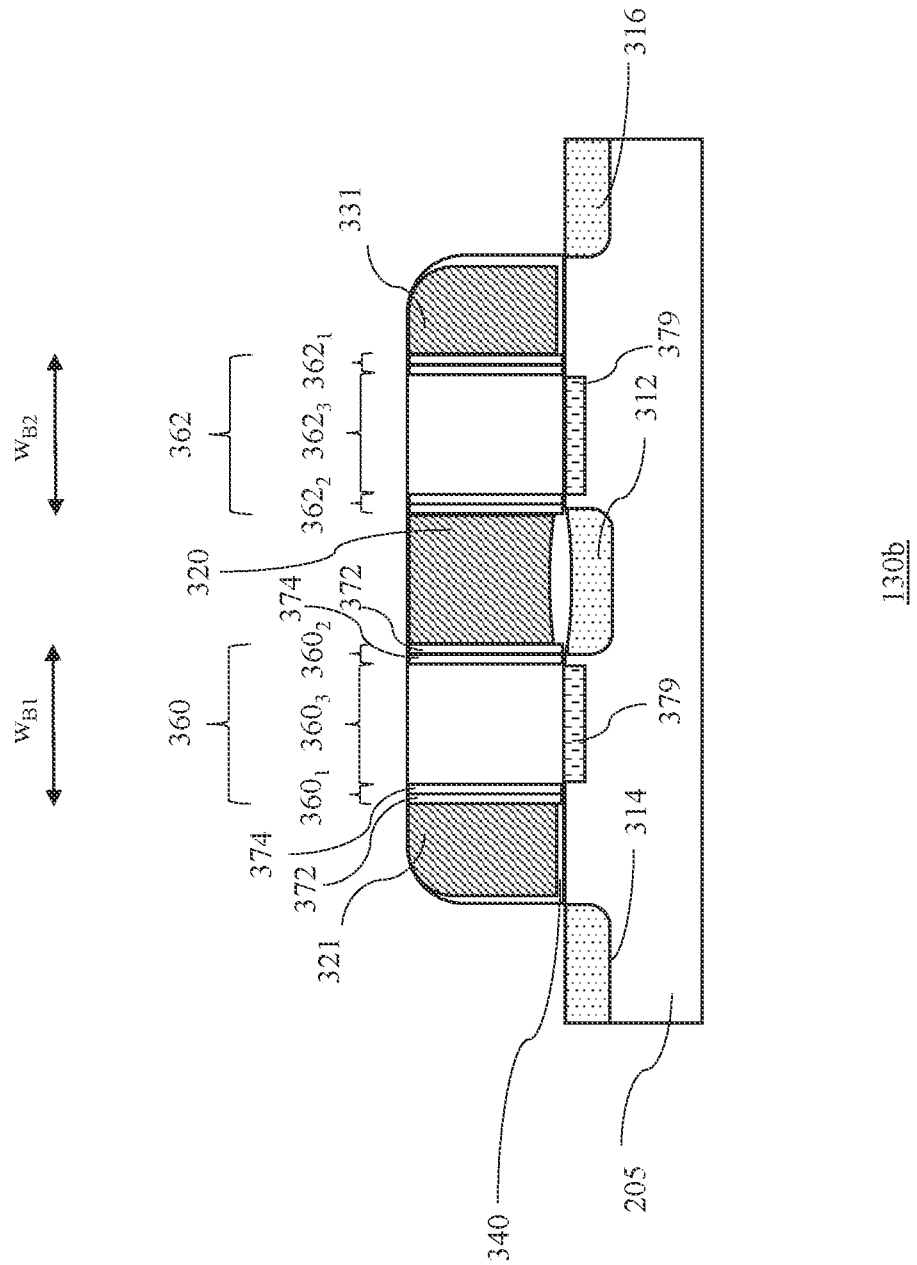
Figure 3B:
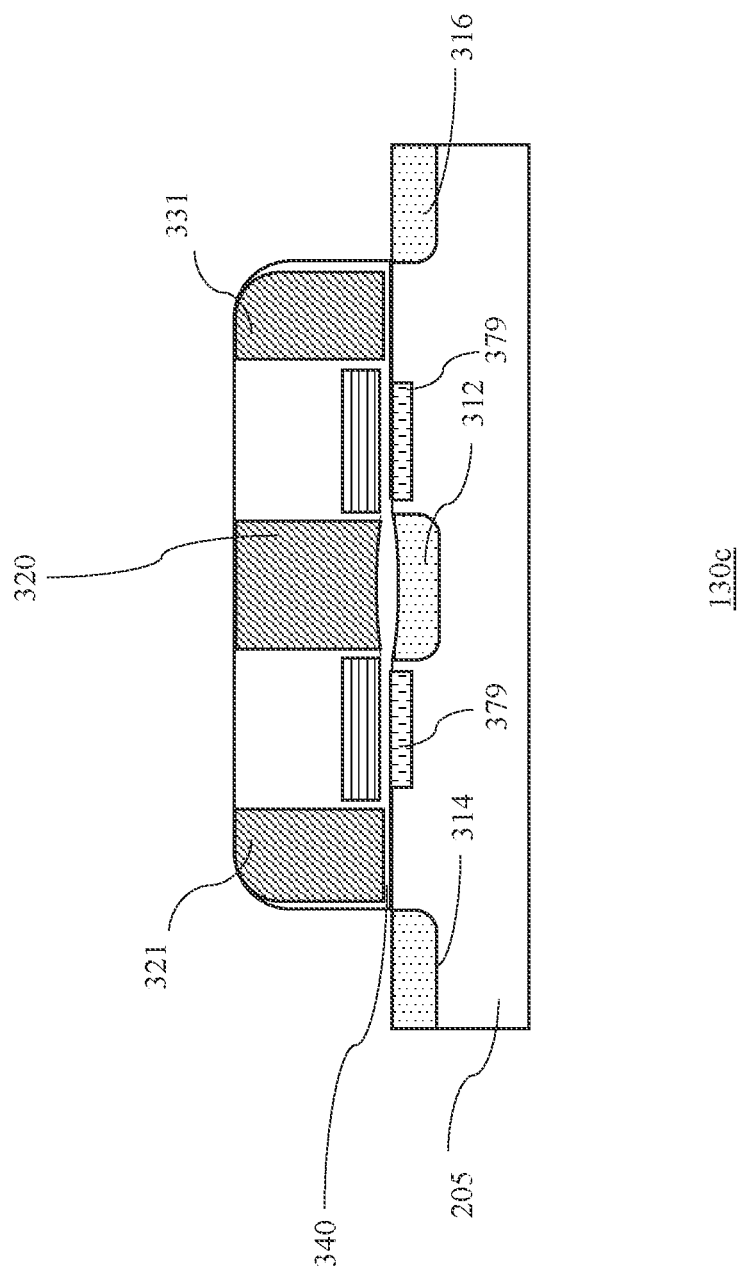

FIGS. 3A, 3BA and 3BB shows simplified cross-sectional view of embodiments of a transistor device 130 along B-B' in the first direction. For example, the transistor device is arranged in a second column of the memory array 100. The second column may be adjacent to the first column. For example, the second column may be between the strap region 120 and the first column containing a plurality of memory devices as described in FIGS. 1-2.

Referring to FIG. 3A, a transistor device 130a includes transistor device first, second and third doped regions 312, 314 and 316 in the substrate 205. For example, the transistor device first doped region may be a source region of the transistor device while the transistor device second and third doped regions may be drain regions of the transistor device. Other configurations may also be useful. In one embodiment, the transistor device first doped region of the transistor device may be in electrical connection with the memory device first doped region of the memory device. For example, the transistor device first doped region of the transistor device and the memory device first doped region of the memory device are coupled to a common SL.

In one embodiment, the transistor device first, second and third doped regions may be doped with dopants of a first polarity type. For example, the first polarity type may be n-type dopants. Other configurations for the dopants may also be useful. For example, the first polarity type may be p-type dopants. The first, second and third doped regions, for example, may be heavily doped regions. The dopant concentration of the first, second and third doped regions, for example, may be about $1 \times 10^{20}$ cm$^{-3}$ in a non-limiting embodiment. Other dopant concentrations may also be useful.

In one non-limiting embodiment, the transistor device 130a includes a first transistor device select gate 321 over a region between the transistor device first doped region 312 and the transistor device second doped region 314, and a second transistor device select gate 331 over a region between the transistor device first doped region 312 and the transistor device third doped region 316. The first and second transistor device select gates, for example, may be polysilicon gates. The polysilicon gates may be doped. Other types of gates may also be useful as known to those skilled in the art. For example, the gates may be formed of different material. The gates may be formed by, for example, CVD. Other techniques for forming the gates may also be useful.

The transistor device 130a further includes a transistor device dielectric layer 340 extending between the first transistor device select gate 321 and the substrate 205, and between the second transistor device select gate 331 and the substrate 205. In other words, the transistor device dielectric layer 340 may be on the substrate 205, and the transistor device select gates 321, 331 may be on the transistor device dielectric layer 340. The transistor device dielectric layer 340 separates the first transistor device select gate 321 as well as the second transistor device select gate 331 from the substrate 205. For example, the transistor device dielectric layer may serve as an insulating dielectric layer for the gates of the transistor device.

The transistor device dielectric layer 340 may be a single dielectric layer. For example, the transistor device dielectric layer 340 may be an oxide layer such as a thermal silicon oxide layer formed from thermal oxidation. In other embodiments, the transistor device dielectric layer 340 may be an oxide layer formed by CVD. Alternatively, the transistor device dielectric layer 340 may be a stack of dielectric layers, i.e. the transistor device dielectric may include a plurality of sub-layers. The transistor device dielectric layer 340 may have a thickness, for example, ranging from about 20 A to 60 A, alternatively from 30 A to 50 A. Other types of dielectric layer or thicknesses may also be useful.

In one embodiment, the transistor device 130a includes a transistor device dielectric barrier 360 extending between the first transistor device select gate and the second transistor device select gate. The transistor device dielectric barrier 360 may be disposed over the transistor device dielectric layer 340. The transistor device dielectric barrier 360, in one embodiment, abuts the first transistor device select gate 321 and the second transistor device select gate 331. For example, a first sidewall of the transistor device dielectric barrier 360 abuts a sidewall of the first transistor device select gate 321, and a second sidewall of the transistor device dielectric barrier 360 abuts a sidewall of the second transistor device select gate 331. For example, the transistor device dielectric barrier may have a width $w_{B1}$ ranging from about 0.3 um to 0.5 um, alternatively from 0.35 um to 0.45 um. The transistor device dielectric barrier, for example, may have a width $w_{B1}$ above 0.3 um. For example, the width of the transistor device dielectric barrier 360 compared to a width of the first transistor device select gate and/or the second transistor device select gate may have a ratio ranging from 3:1 to 5:1.

The transistor device dielectric barrier 360 may be formed of dielectric material. In one embodiment, the transistor device dielectric barrier 360 includes first and second sidewall dielectric spacers 360$_{1\text{-}2}$ and an ILD barrier layer portion 360$_3$. The first sidewall dielectric spacer 360$_1$ lines a sidewall of the first transistor device select gate 321 while the second sidewall dielectric spacer 360$_2$ lines a sidewall of the second transistor device select gate 331. In one embodiment, the first and second sidewall dielectric spacers 360$_{1\text{-}2}$ may each include a first spacer dielectric layer 372 and a second spacer dielectric layer 374. For example, the first spacer dielectric layer 372 may be a silicon oxide layer over or on a sidewall of the transistor device select gate and the second spacer dielectric layer 374 may be a silicon nitride layer disposed over the silicon oxide layer. For example, the first spacer dielectric layer 372 and the second spacer dielectric layer 374 may be formed by CVD. Other types of dielectric materials as well as forming techniques may also be useful. For example, providing first and second sidewall dielectric spacers 360$_{1\text{-}2}$ each having a single dielectric layer such a silicon oxide or silicon nitride may also be useful. The first and second first and second sidewall dielectric spacers 360$_{1\text{-}2}$, for example, isolate the first and second transistor device select gates 321, 331 from silicided substrate regions 379.

As for the ILD barrier layer portion 360$_3$, it may be portion of an ILD layer which is deposited over the memory array as described above. For example, a dielectric layer fills a gap between the first and second sidewall dielectric spacers $360_{1-2}$. The ILD barrier layer portion $360_3$ may be formed of a dielectric material such as silicon oxide. Providing the ILD barrier layer portion $360_3$ with other types of dielectric materials such as silicon nitride may also be useful. The ILD barrier layer portion $360_3$, for example, may be formed by CVD.

As shown, the transistor device 130a is provided without a storage gate and an erase gate in the memory array. For example, the transistor device 130a is provided without a control gate, floating gate and erase gate. For example, one or more control gates, floating gates and an erase gate are absent/removed from a memory device of the memory array to form the transistor device 130a. The memory device in which one or more control gates, floating gates and an erase gate are absent or removed may be initially formed in the array as a dummy memory device. As described, the one or more control gates, floating gates and an erase gate may be absent or removed near the strap region. For example, the one or more control gates, floating gates and an erase gate may be absent or removed from a column adjacent to the strap region. The removal of a control gate near the strap area does not impact control gate pick up, as there is connection out through metal layers in the ILD layer above the transistor device.

In some embodiments, contacts (not shown) may be disposed over the first transistor device select gate 321 and a second transistor device select gate 331. For example, the contact may be a nickel-based silicide contact. For example, the silicide contact may be formed of nickel or nickel alloy. Other types of conductive material for the contacts, such as tungsten, may also be useful.

In some embodiments, the silicided substrate regions 379 may be provided between the first transistor device select gate 321 and the transistor device first doped region 312 and between the second transistor device select gate 331 and the transistor device first doped region 312. For example, the silicide substrate regions 379 may be self-aligned to the first and second sidewall dielectric spacers. For example, a metal layer is formed over the substrate and annealed to cause a reaction with the metal and silicon substrate. The reaction forms metal silicide contacts in the silicided substrate regions 379. Providing silicided substrate regions 379 lowers down resistance. In some embodiments, the transistor device first doped region 312 may be silicided.

FIG. 3BA shows another embodiment of the transistor device 130b. The transistor device may be similar as that described in FIG. 3A. As such, common elements may not be described or described in detail.

Similar to the transistor device 130a in FIG. 3A, the transistor device 130b includes a transistor device dielectric layer 340 extending between the first transistor device select gate 321 and the substrate 205, and between the second transistor device select gate 331 and the substrate 205. In one embodiment, the transistor device 130b further includes a transistor device erase gate 320 over the first doped region 312 of the transistor device. In one embodiment, the transistor device 130b includes a first portion transistor device dielectric barrier 360 and a second portion transistor device dielectric barrier 362 extending between the first transistor device select gate 321 and the second transistor device select gate 331. The first portion transistor device dielectric barrier 360 and the second portion transistor device dielectric barrier 362 may be disposed over the transistor device dielectric layer 340.

The first portion transistor device dielectric barrier 360, in one embodiment, at least partially or fully abuts the first transistor device select gate 321 and the transistor device erase gate 320. For example, a first sidewall of the first portion transistor device dielectric barrier 360 at least partially or fully abuts a sidewall of the first transistor device select gate 321, and a second sidewall of the first portion transistor device dielectric barrier 360 at least partially or fully abuts a first sidewall of the transistor device erase gate 320. As for the second portion transistor device dielectric barrier 362, it at least partially or fully abuts the second transistor device select gate 331 and the transistor device erase gate 320. For example, a first sidewall of the second portion transistor device dielectric barrier 362 at least partially or fully abuts a sidewall of the second transistor device select gate, and a second sidewall of the transistor device dielectric barrier 362 at least partially or fully abuts a second sidewall of the transistor device erase gate 320. For example, the first portion transistor device dielectric barrier 360 may have a width $w_{B1}$ ranging from 0.15 um to 0.3 um, and the second portion transistor device dielectric barrier 362 may have a width $w_{B2}$ ranging from 0.15 um to 0.3 um. The first portion transistor device dielectric barrier 360, for example, may have a width $w_{B1}$ above 0.15 um, and the second portion transistor device dielectric barrier 362 may have a width $w_{B2}$ above 0.15 um. For example, the width of the first portion transistor device dielectric barrier 360 compared to a width of the first transistor device select gate may have a ratio ranging from 1.5:1 to 3:1. For example, the width of the second portion transistor device dielectric barrier 362 compared to a width of the second transistor device select gate may have a ratio ranging from 1.5:1 to 3:1.

The first portion transistor device dielectric barrier 360 and the second portion transistor device dielectric barrier 362 may be formed of dielectric material. In one embodiment, the first portion transistor device dielectric barrier 360 includes first and second sidewall dielectric spacers $360_{1-2}$ and an ILD barrier layer portion $360_3$. The first sidewall dielectric spacer $360_1$ lines a sidewall of the first transistor device select gate 321 while the second sidewall dielectric spacer $360_2$ lines a sidewall of the transistor device erase gate 320. The first and second sidewall dielectric spacers $360_{1-2}$ may each include a first spacer dielectric layer 372 and a second spacer dielectric layer 374. For example, the first spacer dielectric layer 372 may be a silicon oxide layer over or on a sidewall of the transistor device select gate and/or the transistor device erase gate. The second spacer dielectric layer 374 may be a silicon nitride layer disposed over the silicon oxide layer. For example, the first spacer dielectric layer 372 and the second spacer dielectric layer 374 may be formed by CVD. Other types of dielectric materials as well as forming techniques may also be useful. For example, providing first and second sidewall dielectric spacers $360_{1-2}$ each having a single dielectric layer such a silicon oxide or silicon nitride may also be useful. As for the ILD barrier layer portion $360_3$, it may be part of an ILD layer which is deposited over the memory array as described above. The ILD barrier layer portion $360_3$, for example, may be formed by CVD. For example, a dielectric layer deposited over the substrate fills a gap between the first and second sidewall dielectric spacers $360_{1-2}$. The ILD barrier layer portion $360_3$ may be formed of a dielectric material such as silicon oxide. Providing the ILD barrier layer portion $360_3$ with other types of dielectric materials such as silicon nitride may also be useful.

The second portion transistor device dielectric barrier 362 includes first and second sidewall dielectric spacers $362_{1-2}$ and an ILD barrier layer portion $362_3$. The first sidewall dielectric spacer $362_1$ lines a sidewall of the second transistor device select gate 331 while the second sidewall dielectric spacer 362₂ lines a sidewall of the transistor device erase gate 320. Similarly, the first and second sidewall dielectric spacers 362₁₋₂ may each include a first spacer dielectric layer and a second spacer dielectric layer. For example, the first barrier spacer dielectric layer may be a silicon oxide layer over or on a sidewall of the transistor device select gate and/or the transistor device erase gate. The second barrier spacer dielectric layer may be a silicon nitride layer disposed over the silicon oxide layer. Other types of dielectric materials may also be useful. For example, providing first and second sidewall dielectric spacers each having a single dielectric layer such a silicon oxide or silicon nitride may also be useful. The ILD barrier layer portion 362₃ may be similar or formed from the same process as the ILD barrier layer portion 360₃. For example, a dielectric layer deposited over the substrate fills a gap between the first and second sidewall dielectric spacers 362₁₋₂.

As shown, the transistor device 130b is provided without a storage gate in the memory array. For example, the transistor device 130b is provided without a control gate and floating gate. For example, one or more control gates and floating gates are absent or removed from a dummy memory device of the memory array to form the transistor device 130b. The one or more control gates and floating gates may be absent or removed near the strap region. For example, the one or more control gates, floating gates and an erase gate may be absent or removed from a column adjacent to the strap region. The removal of a control gate near the strap area does not impact control gate pick up, as there is connection out through metal layers in the ILD layer.

In some embodiments, silicided substrate regions 379 may be provided between the first transistor device select gate 321 and the transistor device first doped region 312 and between the second transistor device select gate 331 and the transistor device first doped region 312. For example, the silicide substrate regions 379 may be self-aligned to the first and second sidewall dielectric spacers 362₁₋₂.

Figure 3C:
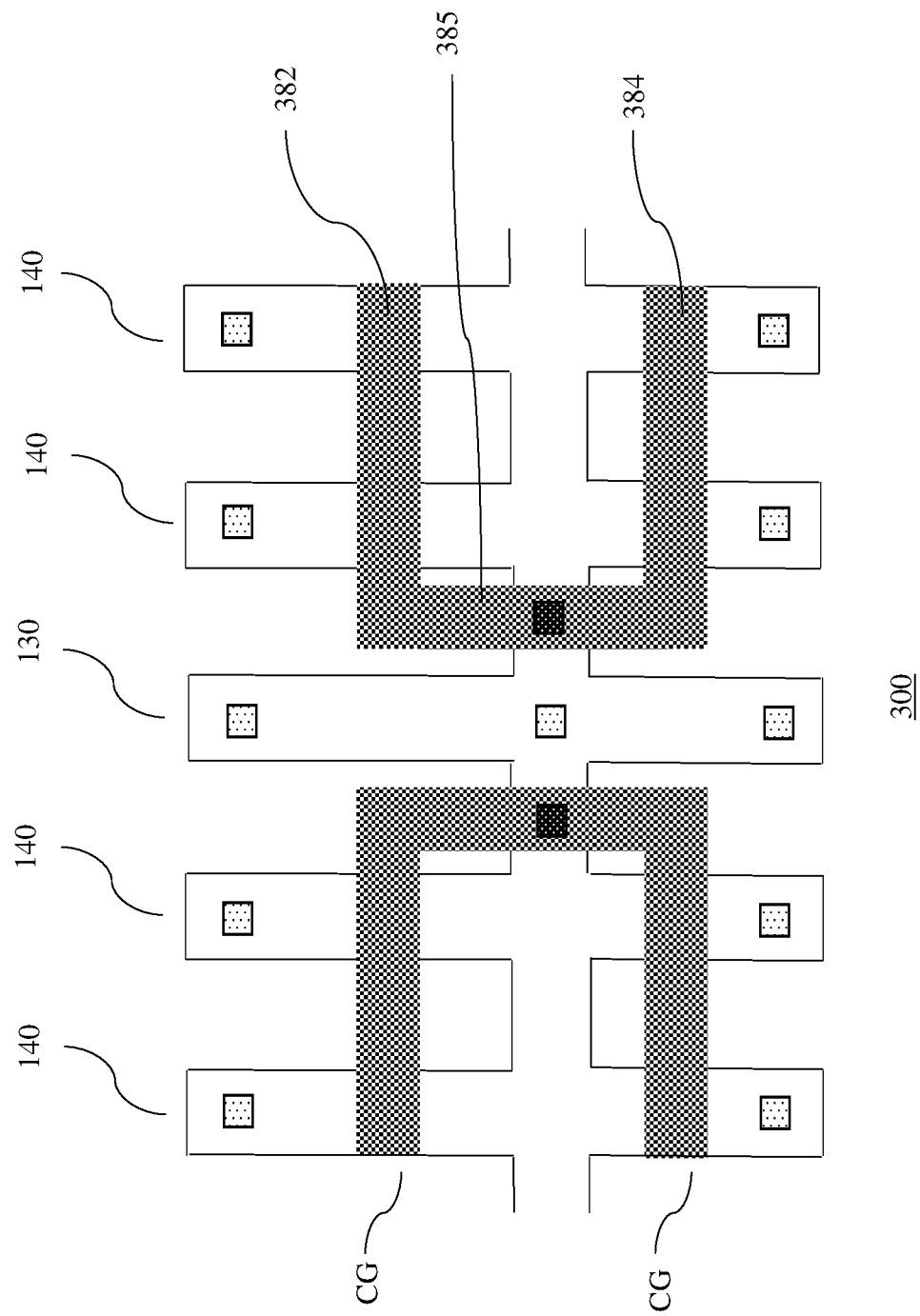
FIG. 3C shows a top view of another embodiment of a memory array.

FIG. 3C shows a simplified top view of another embodiment of a memory array 300. The top view, for example, shows a portion of the memory array 300. The memory array 300 may be similar to the memory array 100 as described in FIG. 1. As such, common elements may not be described or described in detail.

The memory array 300 may include memory devices 140 arranged in a memory region of a substrate. The memory devices 140 may be similar to that as described in FIGS. 1-2. In one embodiment, the memory array includes one or more transistor devices 130. The one or more transistor devices may be similar to that as described in FIGS. 3A-3BA. For example, the one or more transistor devices may serve as SL pull down devices for the memory devices of the memory array. As illustrated, memory device control gates of the memory devices in the array 300 may be formed of control gate layers 382 and 384 which extend across different columns. For example, the control gate layers 382 and 384 each extend the length of a row. In one embodiment, the control gate layers 382 and 384 may be configured to be connected together. For example, a gate layer portion 385 connects the control gate layers 382 and 384. The gate layer portion 385 may be arranged adjacent to a column containing a transistor device 130. For example, the control gate layers and gate layer portion may be formed of the same material in a same deposition step. The control gate layers and gate layer portion, for example, may be formed of polysilicon material. The gate layer portion 385 connecting the control gate layers 382 and 384 enables providing control gate pick up adjacent to the transistor device.

Figure 4A:
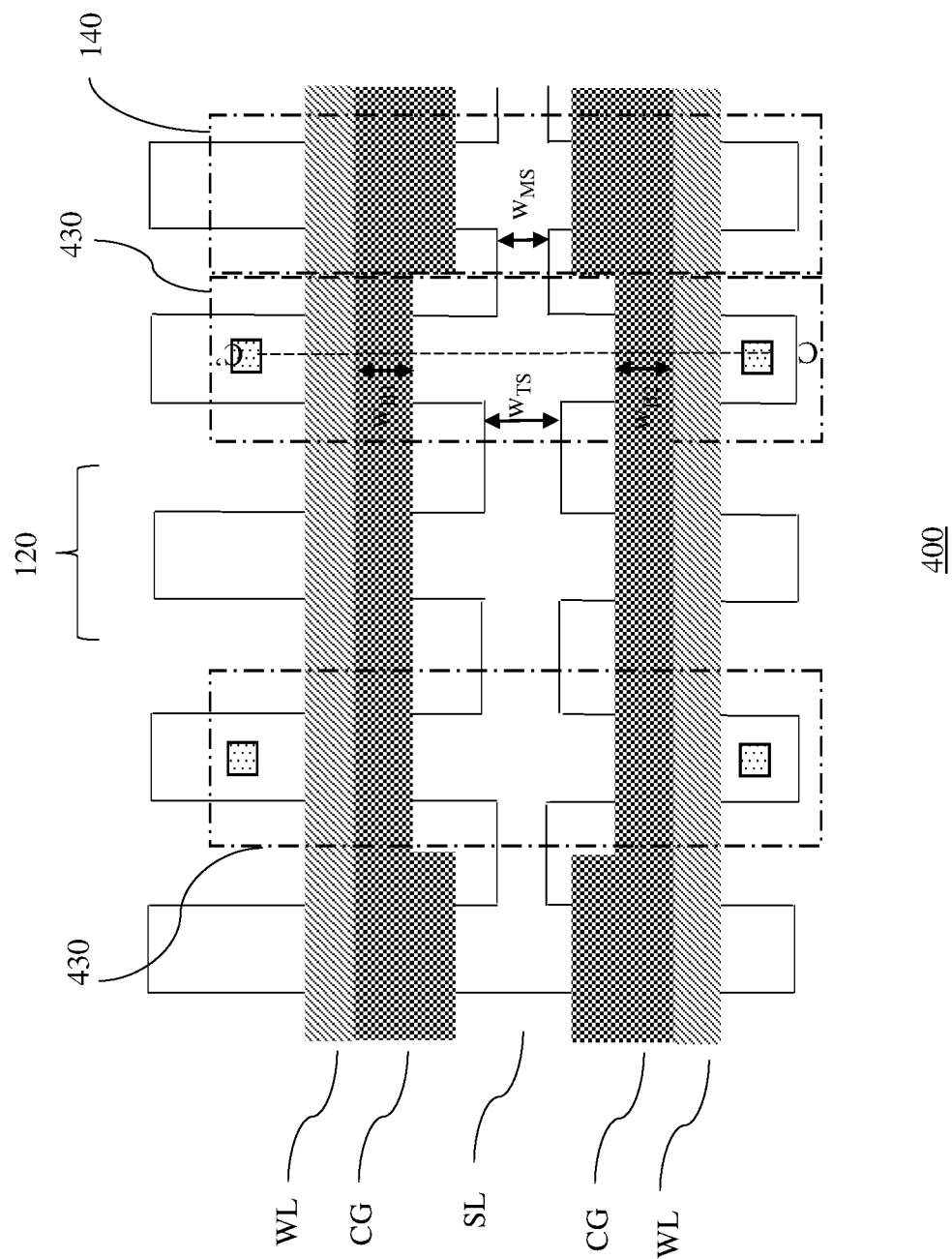
FIG. 4A shows a simplified top view of another embodiment of a memory array.
Figure 4B:
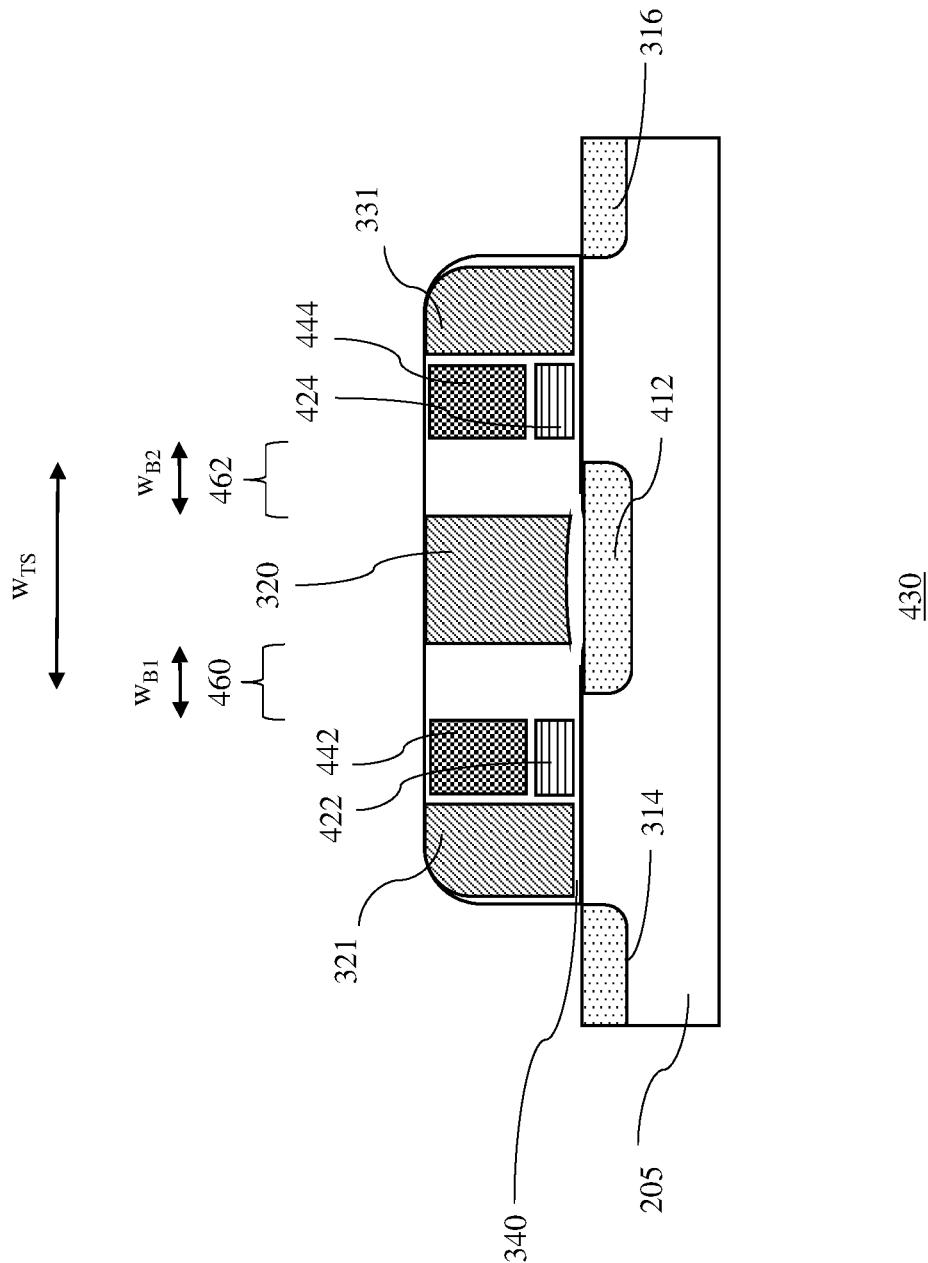
FIG. 4B shows a simplified cross-sectional view of another embodiment of a transistor device in the memory array.

FIG. 4A shows a simplified top view of another embodiment of a memory array 400, while FIG. 4B shows a simplified cross-sectional view of another embodiment of a transistor device in the memory array. The top view, for example, shows a portion of the memory array 400. The memory array 400 may be similar to the memory array 100 as described in FIG. 1. As such, common elements may not be described or described in detail.

As illustrated in FIG. 4A, the memory array includes a strap region 120. In one embodiment, the memory array 400 includes one or more transistor devices 430 which serve as SL pull down devices for the memory devices of the memory array. In one embodiment, transistor devices 430 serving as SL pull down devices may be arranged in columns adjacent to the strap region 120 of the memory array. For example, a transistor device 430 may be located in a column in between the strap region 120 and an adjacent column containing a memory device 140. For example, the transistor device 430 and the memory device 140 are arranged in adjacent columns of the memory array. The memory device 140 may be coupled to the transistor device 430 via a common SL.

The memory device 140 may be similar to that described in FIG. 2. As for the transistor device 430, FIG. 4B shows a simplified cross-sectional view of an embodiment of the transistor device 430 along C-C' in the first direction. The transistor device 430 may be similar to that described in FIG. 3BA. As such, common elements may not be described or described in detail.

The transistor device 430, for example, may be arranged in a second column of the memory array 400. The second column may be between the strap region 120 and a first column containing a memory device 140. The transistor device 430 includes transistor device first, second and third doped regions 412, 314 and 316 in the substrate 205. For example, the transistor device first doped region may be a source region of the transistor device while the transistor device second and third doped regions may be drain regions of the transistor device. Other configurations may also be useful. As described, the transistor device first doped region of the transistor device may be in electrical connection with a memory device doped region of the memory device 140.

The transistor device 430 includes a first transistor device select gate 321 over a region between the transistor device first doped region 412 and the transistor device second doped region 314, and a second transistor device select gate 331 over a region between the transistor device first doped region 412 and the transistor device third doped region 316. In one embodiment, the transistor device first doped region 412 of the transistor device 430 has a width wider than the memory device first doped region of the memory device 140. For example, a width $w_{TS}$ of the transistor device first doped region 412 of the transistor device is wider than a width $w_{TS}$ of the memory device first doped region of the memory device as shown in FIG. 4A. The width $w_{TS}$ of the transistor device first doped region 412 of the transistor device, for example, may be about 0.1 um. The width $w_{TS}$ of the transistor device first doped region 412 of the transistor device is wider than a width $w_{TS}$ of the memory device first doped region of the memory device by at least about 0.07 um.

The transistor device 430 further includes a transistor device dielectric layer 340 extending between the first transistor device select gate 321 and the substrate 205, and between the second transistor device select gate 331 and the substrate 205. The transistor device dielectric layer 340 separates the first transistor device select gate 321 as well as the second transistor device select gate 331 from the substrate 205. For example, the transistor device dielectric layer 340 may serve as an insulating dielectric layer for the gates of the transistor device.

In one embodiment, the transistor device 430 further includes a transistor device erase gate 320 over the transistor device first doped region 412. Additionally, the transistor device 430 includes a first transistor device floating gate 422 between the transistor device erase gate 320 and the first transistor device select gate 321, and a second transistor device floating gate 424 between the transistor device erase gate 320 and the second transistor device select gate 331. A first transistor device control gate 442 may be disposed over the first transistor device floating gate 422, while a second transistor device control gate 444 may be disposed over the second transistor device floating gate 424, as shown in FIG. 4B. For example, the first transistor device control gate 442 may be narrower than the first memory device control gate, and the second transistor device control gate 444 may be narrower than the second memory device control gate.

In one embodiment, the transistor device 430 includes a first portion transistor device dielectric barrier 460 and a second portion transistor device dielectric barrier 462 extending between the first transistor device select gate 321 and the second transistor device select gate 331. The first portion transistor device dielectric barrier 460 and the second portion transistor device dielectric barrier 462 may be disposed over the transistor device dielectric layer 340. The first portion transistor device dielectric barrier 460 at least partially or fully abuts the first transistor device control gate 442, the first transistor device floating gate 422 and the transistor device erase gate 320. For example, sidewalls of the first portion transistor device dielectric barrier 460 at least partially or fully abuts a sidewall of the first transistor device control gate 442, a sidewall of the first transistor device floating gate 422 and a first sidewall of the transistor device erase gate 320. For example, the first portion transistor device dielectric barrier 460 may have a width ranging from about 0.03 um to 0.05 um. The first portion transistor device dielectric barrier 460, for example, may have a width $w_{B1}$ above 0.03 um. For example, the width of the first portion transistor device dielectric barrier 460 compared to a width of the first transistor device select gate may have a ratio ranging from 1:3 to 1:2.

As for the second portion transistor device dielectric barrier 462, it at least partially or fully abuts the second transistor device control gate 444, the second transistor device floating gate 424 and the transistor device erase gate 320. For example, sidewalls of the second portion transistor device dielectric barrier 462 at least partially or fully abuts a sidewall of the second transistor device control gate 444, a sidewall of the second transistor device floating gate 424 and a second sidewall the transistor device erase gate 320. The second portion transistor device dielectric barrier 462 may have a width ranging from about 0.03 um to 0.05 um. The second portion transistor device dielectric barrier 462 may have a width $w_{B2}$ above 0.03 um. For example, the width of the second portion transistor device dielectric barrier 462 compared to a width of the second transistor device select gate may have a ratio ranging from 1:3 to 1:2.

The first portion transistor device dielectric barrier 460 and the second portion transistor device dielectric barrier 462 offset the first transistor device control gate from first transistor device erase gate, and the second transistor device control gate from second transistor device erase gate. The offset, for example, improves erase performance. Additionally, providing the transistor device first doped region 412 of the transistor device 430 having a wider width lowers down SL resistance.

The first portion transistor device dielectric barrier 460 and the second portion transistor device dielectric barrier 462 may be formed of dielectric material. Similar to the first portion transistor device dielectric barrier 360 as described in FIG. 3BA, the first portion transistor device dielectric barrier 460 includes first and second sidewall dielectric spacers and an ILD barrier layer portion. The first sidewall dielectric spacer, for example, lines a sidewall of the first transistor device control gate 442 and a sidewall of the first transistor device floating gate 422, while the second sidewall dielectric spacer lines a sidewall of the transistor device erase gate 320. The first and second sidewall dielectric spacers may each include a first spacer dielectric layer and a second spacer dielectric layer. For example, the first spacer dielectric layer may be a silicon oxide layer over or on a sidewall of the first transistor device control gate and the sidewall of the first transistor device floating gate and/or the transistor device erase gate. The second spacer dielectric layer may be a silicon nitride layer disposed over the silicon oxide layer. As for the ILD barrier layer portion of the first portion transistor device dielectric barrier 460, it may be part of an ILD layer which is deposited over the memory array as described above. For example, a dielectric layer deposited over the substrate fills a gap between the first and second sidewall dielectric spacers. The ILD barrier layer portion may be formed of a dielectric material such as silicon oxide.

As for the second portion transistor device dielectric barrier 462, it may be similar to the second portion transistor device dielectric barrier 360 as described in FIG. 3BA. The second portion transistor device dielectric barrier 462 includes first and second sidewall dielectric spacers and an ILD barrier layer portion. The first sidewall dielectric spacer, for example, lines a sidewall of the second transistor device control gate 444 and a sidewall of the second transistor device floating gate 424, while the second sidewall dielectric spacer lines a sidewall of the transistor device erase gate 320. Similarly, the first and second sidewall dielectric spacers may each include a first spacer dielectric layer and a second spacer dielectric layer. For example, the first barrier spacer dielectric layer may be a silicon oxide layer over or on a sidewall of the second transistor device control gate and the sidewall of the second transistor device floating gate and/or the transistor device erase gate. The second barrier spacer dielectric layer may be a silicon nitride layer disposed over the silicon oxide layer. Other types of dielectric materials may also be useful. The ILD barrier layer portion of the second portion transistor device dielectric barrier may be similar or formed from the same process as the ILD barrier layer portion of the first portion transistor device dielectric barrier. For example, a dielectric layer deposited over the substrate fills a gap between the first and second sidewall dielectric spacers. The ILD barrier layer portion may be formed of a dielectric material such as silicon oxide.

Figure 5A:
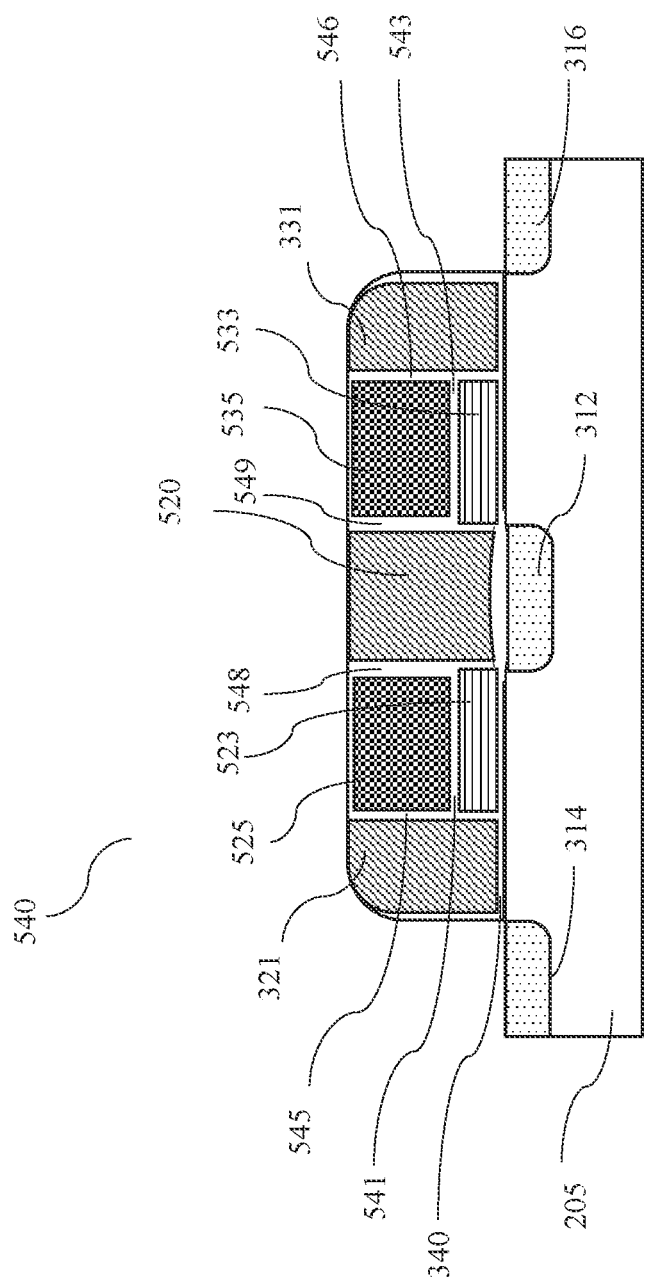
FIGS. 5A-5C show simplified cross-sectional views of an embodiment of a process for forming a transistor device.
Figure 5B:
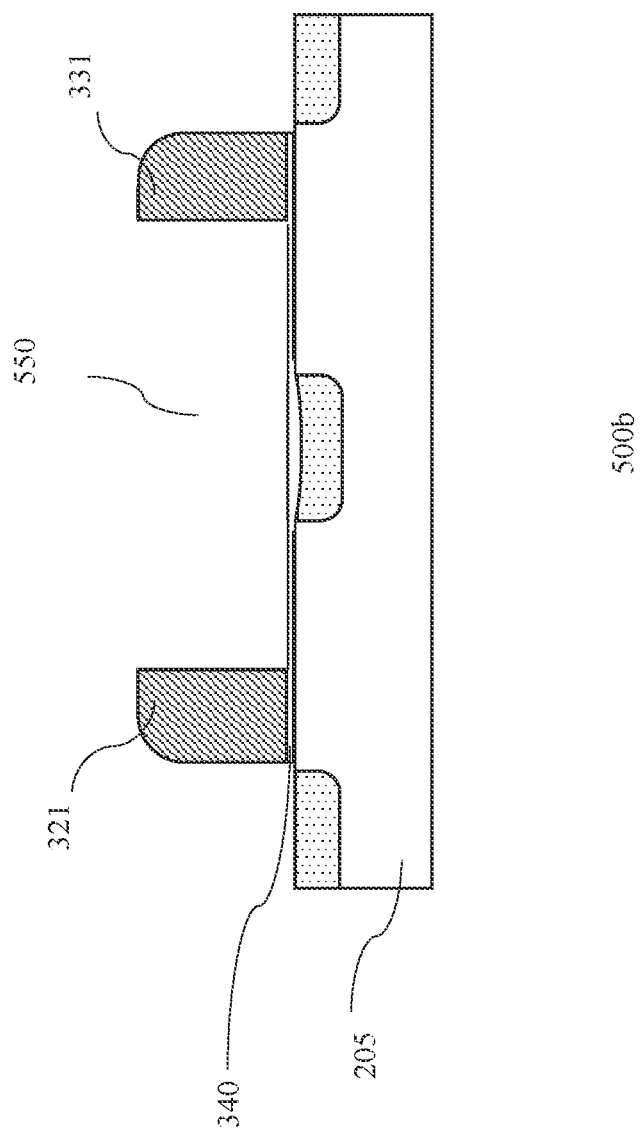
Figure 5C:
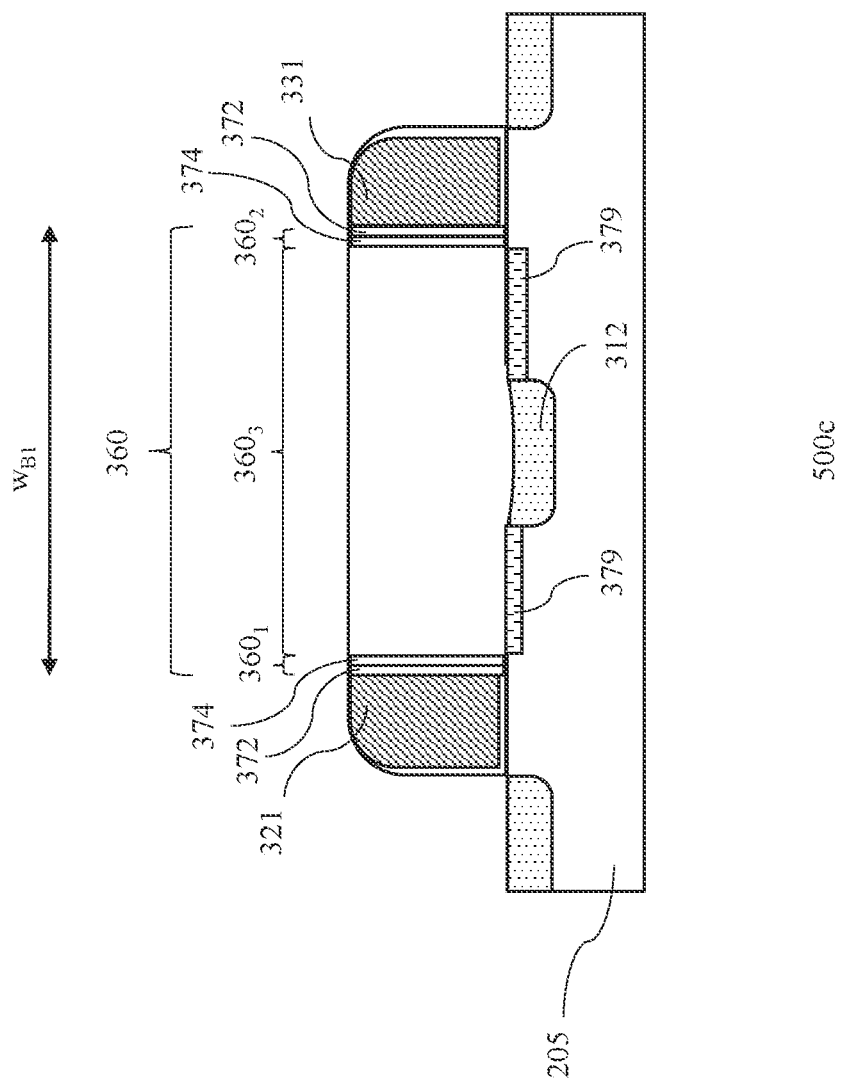

FIGS. 5A-5C show simplified cross-sectional views of an embodiment of a process 500 (including processing stages 500a, 500b and 500c of process 500) for forming a transistor device. The cross-sectional views, for example, are along the first direction or bit line direction of the device. The transistor device, for example, may be similar to that described in FIGS. 1 and 3A. Common elements may not be described or described in detail. For example, the cross-sectional views illustrate a portion of the memory array region of the device. As discussed, the device may include other device regions (not shown), such as logic regions, including HV, MV and LV regions. For example, the various regions include device wells for respective devices.

Referring to FIG. 5A, a substrate 205 is provided. The substrate 205 may be at a processing stage where memory devices have been partially formed on the substrate to form a memory array. For example, a plurality of memory devices may be formed on the substrate 205 as described in FIGS. 1 and 2. In one embodiment, the substrate includes one or more dummy memory devices 540. A dummy memory device, for example, may be formed in the same processing step(s) as the memory devices. For example, the dummy memory device may initially have the same elements as the memory devices and may be further processed to form a transistor device as described. Although only one dummy memory device 540 is shown, it is understood that the substrate may be processed to include a plurality of dummy memory devices.

The dummy memory device 540 may have a similar configuration to the memory devices as described in FIG. 2. The memory device 540 is further processed to form a transistor device. For example, the memory device 540 is processed to form a transistor device 130a similar to that described in FIG. 3A. For example, the dummy memory device 540 may initially serve as a dummy memory device to form one or more transistor devices of the memory array.

Providing the dummy memory device 540 includes forming transistor device first, second and third doped regions 312, 314 and 316 in the substrate 205. For example, the transistor device first doped region may be a source region while the transistor device second and third doped regions may be drain regions. Other configurations may also be useful. For example, the transistor device first doped region may be a drain region while the transistor device second and third doped regions may be source regions. The transistor device first doped region of the dummy memory device may be in electrical connection with a memory device first doped region of a memory device in an adjacent column. The transistor device first doped region may be formed by a first implant step, while the transistor device second and third doped regions may be formed by a second implant step. Other configurations for forming the doped regions may also be useful.

In one embodiment, providing the dummy memory device 540 includes forming a first transistor device select gate 321 over a region between the transistor device first doped region 312 and the transistor device second doped region 314, and a second transistor device select gate 331 over a region between the transistor device first doped region 312 and the transistor device third doped region 316. Additionally, a transistor device erase gate 520 may be formed over the transistor device first doped region 312.

As shown, a first transistor device floating gate 523 is formed between the transistor device erase gate 520 and the first transistor device select gate 321. A first transistor device control gate 525 may be formed over the first transistor device floating gate 523. Additionally, a second transistor device floating gate 533 may be formed between the transistor device erase gate 520 and the second transistor device select gate 331. Further, a second transistor device control gate 535 may be formed over the second transistor device floating gate 533.

The different gates of the memory device, for example, may be polysilicon gates. The polysilicon gates may be doped. Other types of gates may also be useful. For example, the gates may be formed of different material. The gates may be formed by, for example, chemical vapor deposition (CVD). Other techniques for forming the gates may also be useful.

The first and second transistor device select gates, transistor device erase gate, first and second transistor device control gates may be separated from the substrate by a transistor device dielectric layer 340. In one embodiment, the transistor device dielectric layer 340 extending between the first transistor device select gate and the substrate, between the second transistor device select gate and the substrate, between the first transistor device floating gate and the substrate, between the second transistor device floating gate and the substrate, and between the transistor device erase gate and the substrate is formed. For example, the transistor device dielectric layer may serve as an insulating dielectric layer for the gates.

The transistor device dielectric layer 340 may be a single dielectric layer. For example, the transistor device dielectric layer may be an oxide layer such as a thermal silicon oxide layer formed from thermal oxidation. In other embodiments, the transistor device dielectric layer may be an oxide layer formed by CVD. Alternatively, the transistor device dielectric layer may be a stack of dielectric layers.

As for the first and second transistor device control gates, they may be separated from the first and second transistor device floating gates by forming first and second control gate dielectrics 541 and 543. In addition, a first transistor device select gate sidewall dielectric 545 is formed between the first transistor device select gate 321 and the first storage gate (the first storage gate including the first transistor device floating gate 523 and first transistor device control gate 525). A second transistor device select gate sidewall dielectric 546 is formed between the second transistor device select gate 331 and the second storage gate (the second storage gate including the second transistor device floating gate 533 and second transistor device control gate 535). The first and second memory device select gate sidewall dielectrics 545 and 546 may include dielectric layers such as silicon oxide layers. Alternatively, the first and second transistor device select gate sidewall dielectrics may be stack of dielectric layers such as a combination of oxide and nitride layers.

In one embodiment, a first transistor device erase gate sidewall dielectric 548 may be formed between the transistor device erase gate 520 and the first storage gate (the first storage gate including the first transistor device floating gate 523 and first transistor device control gate 525). A second transistor device erase gate sidewall dielectric 549 may be formed between the transistor device erase gate 520 and the second storage gate (the second storage gate including the second transistor device floating gate 533 and second transistor device control gate 535). For example, the first and second transistor device erase gate sidewall dielectrics may be dielectric stacks which include a plurality of dielectric layers such as a combination of oxide and nitride layers. Alternatively, the first and second transistor device erase gate sidewall dielectrics may be single dielectric layer such as an oxide layer.

Referring to FIG. 5B, the transistor device erase gate 520, the first and second transistor device floating gates 523, 533 and the first and second transistor device control gates 525, 535 are absent or removed from the substrate 205. For example, a mask and etch technique is used to remove the transistor device erase gate, the first and second transistor device floating gates 523, 533 and the first and second transistor device control gates 525, 535 from the substrate 205 in a dry etching process. For example, a hard mask is disposed over the substrate. The hard mask may be patterned using a patterned soft mask, such as a patterned photoresist layer. The photoresist layer may be patterned by exposing it with an exposure source through a reticle. The pattern of the reticle is transferred to the photoresist layer after development. For example, the patterned resist mask exposes a portion between the first and second transistor device select gates for patterning, and protects other portions of the substrate.

An etch may be performed to pattern the hard mask. The etch, for example, is an anisotropic etch, such as a reactive ion etch (RIE). After patterning the hard mask, the photoresist layer may be removed by, for example, ashing. The patterned hard mask serves as an etch mask for removing the first and second transistor device floating gates and the first and second transistor device control gates. Another RIE process which removes the transistor device erase gate may be performed to define the first and second transistor device select gates 321, 331. For example, a first etch removes the first and second transistor device floating gates 523, 533 and the first and second transistor device control gates 525, 535 while a second etch removes the transistor device erase gate 520. The etch forms a transistor device trench 550 in the dummy memory device. As illustrated in FIG. 5B, the transistor device dielectric layer 340 remains on the substrate 205. For example, a portion of a thickness of the transistor device dielectric layer 340 may be etched, however, a remaining portion of the thickness of the transistor device dielectric layer 340 remains on the substrate 205. The first and second memory device select gate sidewall dielectrics, for example, may be completely removed during the etching step.

The process continues to form a transistor device dielectric barrier 360 between the first and second transistor device select gates 321, 331. In one embodiment, first and second sidewall dielectric spacers 360$_{1-2}$ and an ILD barrier layer portion 360$_3$ may be formed between the first and second transistor device select gates 321, 331, as illustrated in FIG. 5C. For example, a first dielectric layer may be formed over the substrate by, for example, CVD. The first dielectric layer may be anisotropically etched, such as by RIE, to remove horizontal portions, leaving first spacer dielectric layer 372 on the sidewalls of the first and second transistor device select gates 321, 331. A second dielectric layer is then formed over the first spacer dielectric layer 372 by, for example, CVD. The second dielectric layer may be anisotropically etched, such as by RIE, to remove horizontal portions, leaving second spacer dielectric layer 374 on the first spacer dielectric layer 372. The first spacer dielectric layer 372 and the second spacer dielectric layer 374 forms the first and second sidewall dielectric spacers 360$_{1-2}$ of the transistor device dielectric barrier 360. The first barrier spacer dielectric layer 372 may be a silicon oxide layer while the second barrier spacer dielectric layer 374 may be a silicon nitride layer. Other types of dielectric materials as well as techniques for forming the first and second sidewall dielectric spacers 360$_{1-2}$ may also be useful.

A third dielectric layer may be deposited over the substrate to form the ILD barrier layer portion 360$_3$. For example, the third dielectric layer may be part of an ILD layer. The third dielectric layer fills a gap between the first and second sidewall dielectric spacers 360$_{1-2}$ to form the ILD barrier layer portion 360$_3$ of the transistor device dielectric barrier 360. The ILD barrier layer portion 360$_3$, for example, may be formed by CVD. The ILD barrier layer portion 360$_3$ may be formed by depositing a dielectric material such as silicon oxide. Providing other types of dielectric materials such as silicon nitride may also be useful. Excess dielectric material formed by deposition may be removed. For example, the excess dielectric material for forming the ILD barrier layer portion 360$_3$ may be planarized by ILD chemical mechanical polishing. Other techniques may also be useful.

As shown in FIG. 5C, the transistor device dielectric barrier 360 extends between the first transistor device select gate 321 and the second transistor device select gate 331. The transistor device dielectric barrier 360 may be disposed on the transistor device dielectric layer 340. The transistor device dielectric barrier 360, in one embodiment, at least partially or fully abuts the first transistor device select gate 321 and the second transistor device select gate 331. For example, a first sidewall of the transistor device dielectric barrier 360 at least partially or fully abuts a sidewall of the first transistor device select gate 321, and a second sidewall of the transistor device dielectric barrier 360 at least partially or fully abuts a sidewall of the second transistor device select gate 331. For example, the transistor device dielectric barrier may have a width $w_{B1}$ ranging from 0.3 um to 0.5 um. For example, the width $w_{B1}$ of the transistor device dielectric barrier 360 compared to a width of the first transistor device select gate and/or second transistor device select gate may have a ratio ranging from 3:1 to 5:1.

In some embodiments, silicided substrate regions 379 may be formed between the first transistor device select gate 321 and the transistor device first doped region 312 and between the second transistor device select gate 331 and the transistor device first doped region 312. For example, the silicided substrate regions 379 may be self-aligned to the first and second sidewall dielectric spacers. The silicided substrate regions 379, for example, may be formed after forming the first and second dielectric barrier spacer portions 360$_{1-2}$ and prior to forming the ILD barrier layer portion 360$_3$. A metal layer may be deposited over the substrate and annealed to cause a reaction with the silicon substrate. The reaction forms metal silicide contacts in the silicided substrate regions 379. In some embodiments, the transistor device first doped region 312 may also be silicided.

As shown, the transistor device 130a similar to that described in FIG. 3A is formed in the memory array. For example, the transistor device 130a is formed without a control gate, floating gate and erase gate in its final form. The one or more control gates, floating gates and an erase gate may be absent or removed near the strap region. For example, the one or more control gates, floating gates and an erase gate may be absent or removed from a column adjacent to the strap region. For example, removing the erase gate near the strap area will not have any impact as the EGL was already interrupted at a CGSL of a strap region.

The hard mask may then be removed and the process 500 continues to complete formation of the memory array. For example, silicide contacts may be formed over the first transistor device select gate 521 and the second transistor device select gate 531. The silicide contact may be a nickel-based silicide contact. For example, the silicide contact may be formed of nickel or nickel alloy. Back-end of line (BEOL) processing is then performed on the memory array. The BEOL processing includes forming additional interconnect levels of the ILD layer over the plurality of memory devices and one or more transistor devices of the memory array. For example, the ILD layer includes a plurality of ILD or interconnect levels. An ILD level includes a metal dielectric level over a contact dielectric level. The metal and contact level dielectrics may be silicon oxide. Providing other dielectric materials such as low k dielectrics may also be useful. The metal and contact level dielectrics, for example, may be formed by CVD. The metal and contact level dielectrics may also be formed by other techniques. The contacts and metal lines in the ILD layer may be coupled to the terminals of the memory devices and the one or more transistor devices of the memory array to provide electrical connections to external contacts.

Figure 6A:
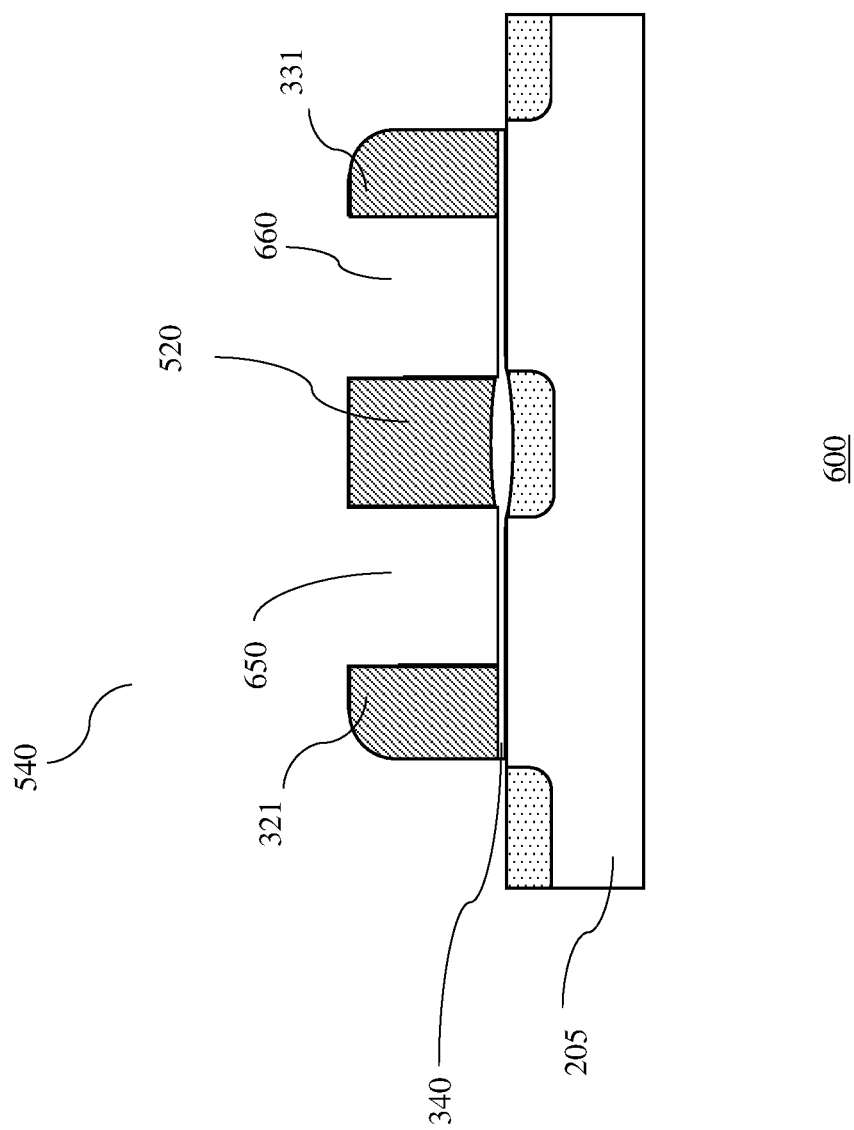
FIGS. 6A-6B show simplified cross-sectional views of another embodiment of a process for forming a transistor device.
Figure 6B:
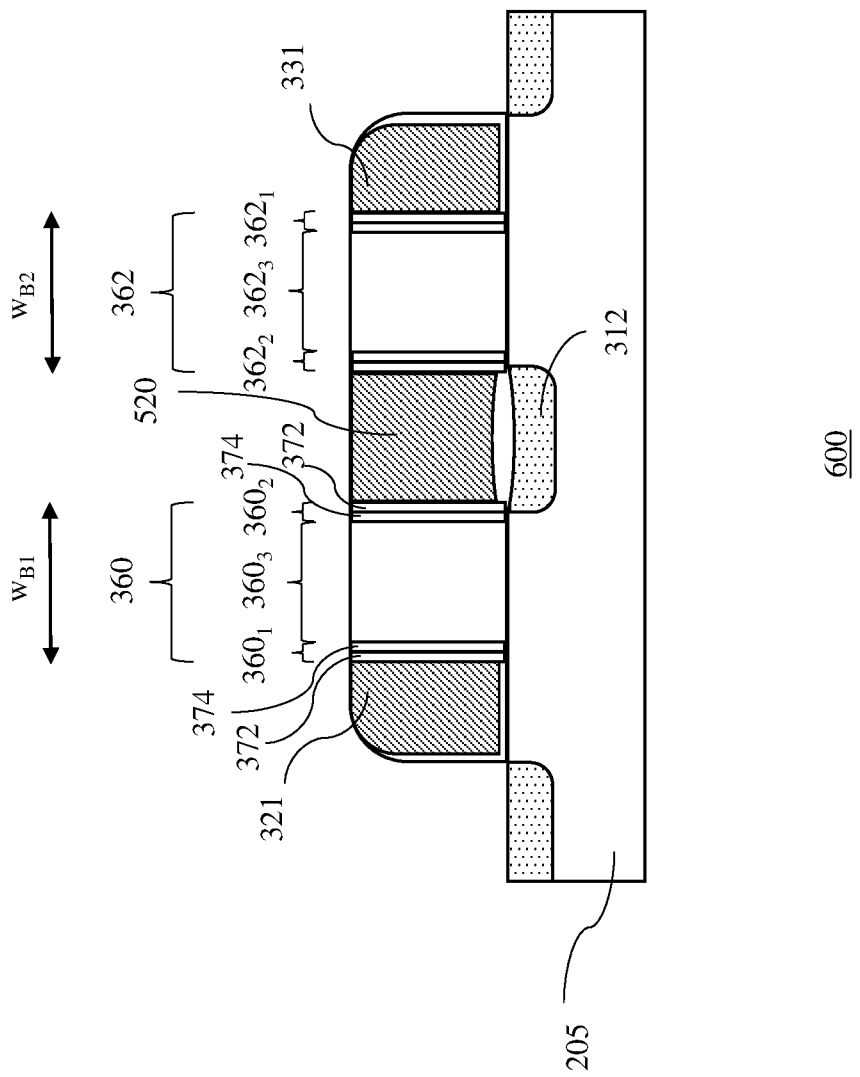

FIGS. 6A-6B show simplified cross-sectional views of another embodiment of a process 600 for forming a transistor device. The cross-sectional views, for example, are along the first direction or bit line direction of the device. The transistor device, for example, may be similar to that described in FIGS. 1 and 3BA. For example, the cross-sectional views illustrate a portion of the memory array region of the device.

A substrate 205 may be provided. The substrate 205 may be at the same processing stage where memory devices have been partially formed on the substrate 205 to form a memory array, as described in FIG. 5A. As such, common elements may not be described or described in detail. For example, the substrate includes one or more dummy memory devices. The dummy memory device 540 may have a similar configuration to the memory devices as described in FIG. 2. The memory device 540 is further processed to form a transistor device. For example, the memory device 540 is processed to form a transistor device 130b similar to that described in FIG. 3BA. For example, the dummy memory device 540 may initially serve as a dummy memory device to form one or more transistor devices 130b of the memory array.

In one embodiment, first and second transistor device floating gates 523, 533 and first and second transistor device control gates 525, 535 are removed from the substrate 205. For example, a mask and etch technique is used to remove the first and second transistor device floating gates 523, 533 and the first and second transistor device control gates 525, 535 from the substrate 205 in a dry etching process. For example, a hard mask is disposed over the substrate. The hard mask may be patterned using a patterned soft mask, such as a patterned photoresist layer. The photoresist layer may be patterned by exposing it with an exposure source through a reticle. The pattern of the reticle is transferred to the photoresist layer after development. For example, the patterned resist mask exposes portions between the first transistor device select gate 321 and the transistor device erase gate 520 as well as between the second transistor device select gate 331 and the transistor device erase gate 520 for patterning.

An etch may be performed to pattern the hard mask. The etch, for example, is an anisotropic etch, such as a reactive ion etch (RIE). After patterning the hard mask, the photoresist layer may be removed by, for example, ashing. The patterned hard mask serves as an etch mask for removing the first and second transistor device floating gates 523, 533 and the first and second transistor device control gates 525, 535.

As illustrated in FIG. 6A, the etch forms a first transistor device trench 650 and a second transistor device trench 660 in the dummy memory device. The transistor device dielectric layer 340, in one embodiment, remains on the substrate. For example, a portion of a thickness of the transistor device dielectric layer 340 may be etched, however, a remaining portion of the thickness of the transistor device dielectric layer 340 remains on the substrate. For example, select gate sidewall dielectrics as well as erase gate sidewall dielectrics may be completely removed during the etching step.

The process continues to form a first portion transistor device dielectric barrier 360 and a second portion transistor device dielectric barrier 362, as illustrated in FIG. 6B. In one embodiment, forming the first portion transistor device dielectric barrier 360 includes forming first and second sidewall dielectric spacers $360_{1\text{-}2}$ and an ILD barrier layer portion $360_3$ between the first transistor device select gates 321 and the transistor device erase gate 520. Similarly, forming the second portion transistor device dielectric barrier 362 includes forming first and second sidewall dielectric spacers $362_{1\text{-}2}$ and an ILD barrier layer portion $362_3$ between the second transistor device select gates 331 and the transistor device erase gate 520.

For example, a first dielectric layer may be formed over the substrate by, for example, CVD. The first dielectric layer may be anisotropically etched, such as by RIE, to remove horizontal portions, leaving first spacer dielectric layer 372 on the sidewalls of the first and second transistor device select gates 321, 331 and on the sidewalls of the transistor device erase gate 520. A second dielectric layer is then formed over the first spacer dielectric layer 372 by, for example, CVD. The second dielectric layer may be anisotropically etched, such as by RIE, to remove horizontal portions, leaving second spacer dielectric layer 374 on the first spacer dielectric layer 372. The first spacer dielectric layer 372 and the second spacer dielectric layer 374 forms the first sidewall dielectric spacers $360_1$ and $362_1$ and the second sidewall dielectric spacers $360_2$ and $362_2$. For example, the first barrier spacer dielectric layer 372 may be a silicon oxide layer while the second barrier spacer dielectric layer 374 may be a silicon nitride layer. Other types of dielectric materials as well as techniques for forming the sidewall dielectric spacers may also be useful.

A third dielectric layer may be deposited over the substrate to form the ILD barrier layer portions $360_3$ and $362_3$. For example, the third dielectric layer may be part of an ILD layer. The third dielectric layer fills a gap between the first and second sidewall dielectric spacers $360_{1\text{-}2}$ to form the ILD barrier layer portion $360_3$ of the first portion transistor device dielectric barrier 360. Similarly, the third dielectric layer fills a gap between the first and second sidewall dielectric spacers $362_{1\text{-}2}$ to form the ILD barrier layer portion $362_3$ of the second portion transistor device dielectric barrier 362. The ILD barrier layer portions $360_3$, $362_3$, for example, may be formed by CVD. The ILD barrier layer portions $360_3$, $362_3$ may be formed by depositing a dielectric material such as silicon oxide. Providing other types of dielectric materials such as silicon nitride may also be useful. Excess dielectric material formed by deposition may be removed. For example, the excess dielectric material for forming the ILD barrier layer portions $360_3$, $362_3$ may be planarized by ILD chemical mechanical polishing. Other techniques may also be useful.

As shown in FIG. 6B, the first portion transistor device dielectric barrier 360 and the second portion transistor device dielectric barrier 362 extend between the first transistor device select gate 321 and the second transistor device select gate 331. For example, the first portion transistor device dielectric barrier 360 and the second portion transistor device dielectric barrier 362 may be formed over the transistor device dielectric layer 340. The first portion transistor device dielectric barrier 360, in one embodiment, at least partially or fully abuts the first transistor device select gate 321 and the transistor device erase gate 520. For example, a first sidewall of the first portion transistor device dielectric barrier 360 at least partially or fully abuts a sidewall of the first transistor device select gate 321, and a second sidewall of the first portion transistor device dielectric barrier 360 at least partially or fully abuts a first sidewall of the transistor device erase gate 520. For example, the first portion transistor device dielectric barrier 360 may have a width $w_{B1}$ ranging from 0.15 um to 0.3 um. For example, the width $w_{B1}$ of the first portion transistor device dielectric barrier 360 compared to a width of the first transistor device select gate may have a ratio ranging from 1.5:1 to 3:1.

As for the second portion transistor device dielectric barrier 362, it at least partially or fully abuts the second transistor device select gate 331 and the transistor device erase gate 520. For example, a first sidewall of the second portion transistor device dielectric barrier 362 at least partially or fully abuts a sidewall of the second transistor device select gate 331, and a second sidewall of the second portion transistor device dielectric barrier 362 at least partially or fully abuts a second sidewall of the transistor device erase gate 520. For example, the second portion transistor device dielectric barrier may have a width $w_{B2}$ ranging from 0.15 um to 0.3 um. For example, the width $w_{B2}$ of the second portion transistor device dielectric barrier 362 compared to a width of the second transistor device select gate may have a ratio ranging from 1.5:1 to 3:1.

As shown, the transistor device 130b similar to that described in FIG. 3BA is formed in the memory array. For example, the transistor device 130b is formed such that it is without a control gate and floating gate in the memory array. In some embodiments, silicided substrate regions be formed between the first transistor device select gate 321 and the transistor device first doped region 312 and between the second transistor device select gate 331 and the transistor device first doped region 312 (not shown). For example, the silicided substrate regions may be self-aligned to the sidewall dielectric spacers. The hard mask may then be removed and the process 600 continues to complete formation of the memory array, similar to the process 500 as described in FIG. 5C after forming the transistor device dielectric barrier onwards.

Figure 7A:
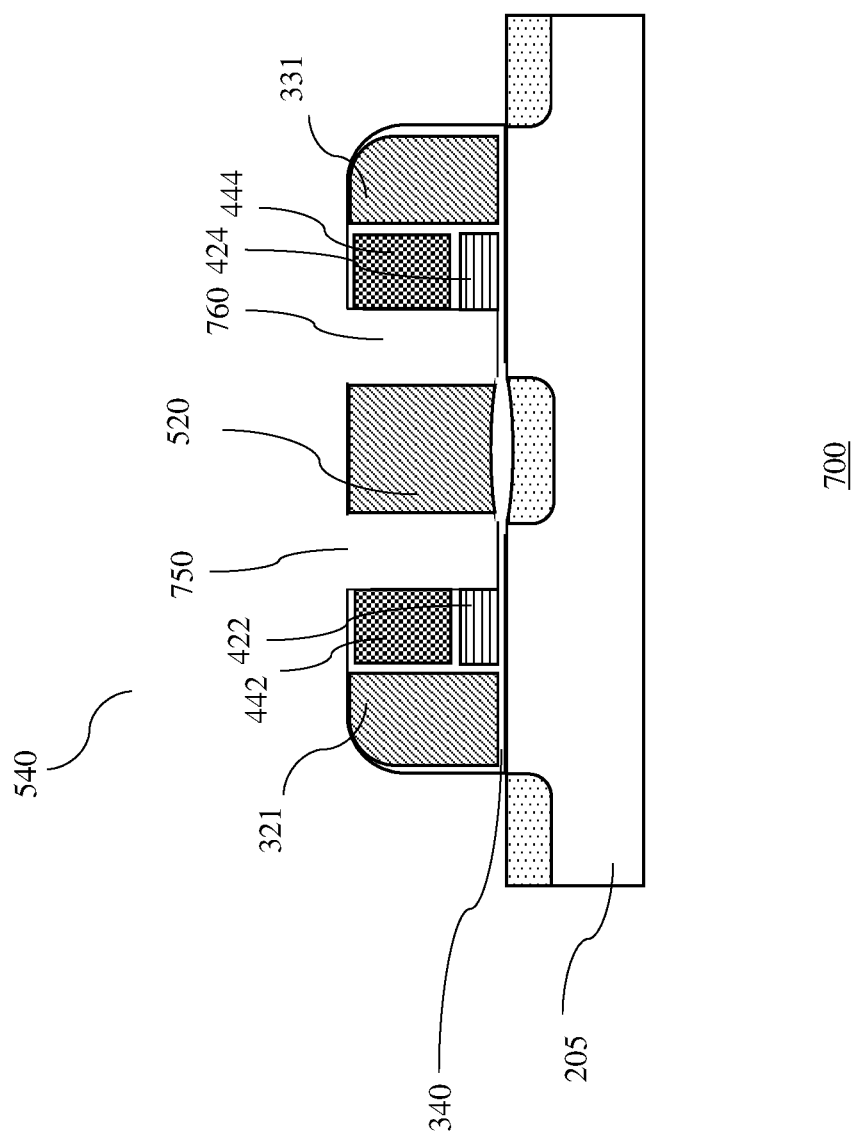
FIGS. 7A-7B show simplified cross-sectional views of yet another embodiment of a process for forming a transistor device.
Figure 7B:
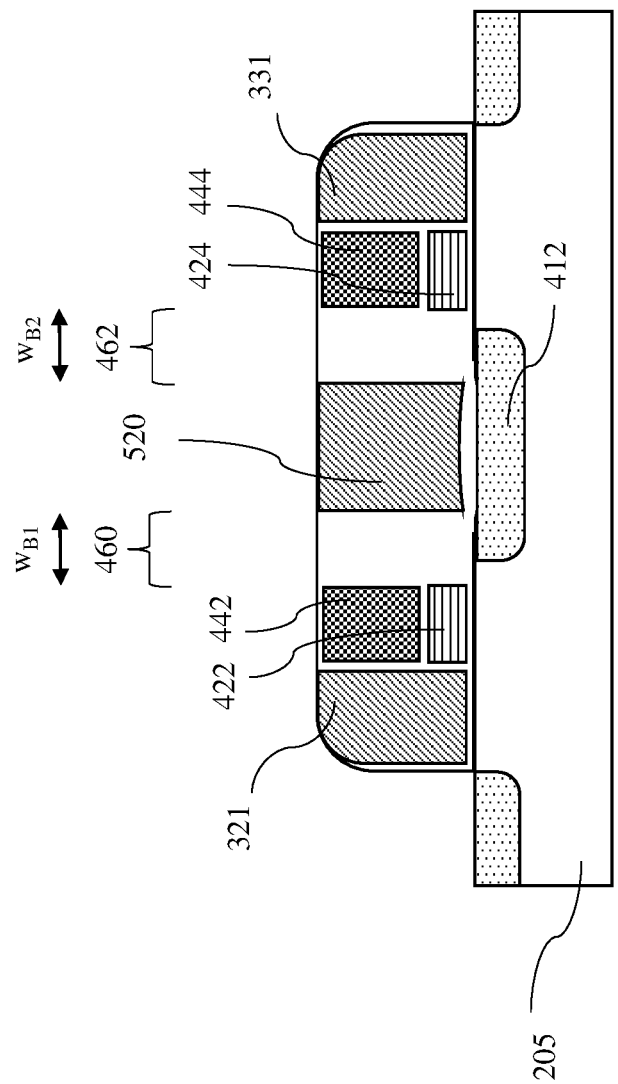

FIGS. 7A-7B show simplified cross-sectional views of yet another embodiment of a process 700 for forming a transistor device. The cross-sectional views, for example, are along the first direction or bit line direction of the device. The transistor device, for example, may be similar to that described in FIGS. 1, 4A and 4B. For example, the cross-sectional views illustrate a portion of the memory array region of the device.

A substrate 205 may be provided. The substrate 205 may be at the same processing stage where memory devices have been partially formed on the substrate 205 to form a memory array, as described in FIG. 5A. As such, common elements may not be described or described in detail. For example, the substrate includes one or more dummy memory devices. A dummy memory device 540 may have a similar configuration to the memory device as described in FIG. 2. The memory device 540 is further processed to form a transistor device of the memory array. For example, the memory device 540 is processed to form a transistor device 430 similar to that described in FIB. 4B. For example, the dummy memory device 540 may initially serve as a dummy memory device to form one or more transistor devices 430 of the memory array.

In one embodiment, a portion of a first transistor device control gate 525, a portion of a first transistor device floating gate 523, a portion of a second transistor device control gate 535 and a portion of a second transistor device floating gate 533 are removed from the substrate. For example, a mask and etch technique is used to remove the portion of the first transistor device control gate 525, the portion of the first transistor device floating gate 523, the portion of the second transistor device control gate 535 and the portion of a second transistor device floating gate 533 in a dry etching process. A remaining portion of the first transistor device control gate 525 forms the first transistor device control gate 442, a remaining portion of the first transistor device floating gate 523 forms the first transistor device floating gate 422, a remaining portion of the second transistor device control gate 535 forms the second transistor device control gate 444, and a remaining portion of the second transistor device floating gate 533 forms the second transistor device floating gate 424, as illustrated in FIG. 7A. As illustrated in FIG. 7A, the etch forms a first transistor device trench 750 and a second transistor device trench 760 in the dummy memory device.

The process continues to form a first portion transistor device dielectric barrier 460 and a second portion transistor device dielectric barrier 462, as illustrated in FIG. 7B. Similar to the embodiment as described in FIG. 6B, forming the first portion transistor device dielectric barrier 460 and the second portion transistor device dielectric barrier 462 each includes forming first and second sidewall dielectric spacers and an ILD barrier layer portion.

For example, a first dielectric layer may be formed over the substrate by, for example, CVD. The first dielectric layer may be anisotropically etched, such as by RIE, to remove horizontal portions, leaving first spacer dielectric layer on the sidewalls of the first transistor device control gate 442 and the first transistor device floating gate 422, on the sidewalls of the second transistor device control gate 444 and the second transistor device floating gate 424 and on the sidewalls of the transistor device erase gate 520. A second dielectric layer is then formed over the first spacer dielectric layer by, for example, CVD. The second dielectric layer may be anisotropically etched, such as by RIE, to remove horizontal portions, leaving second spacer dielectric layer on the first spacer dielectric layer. The first spacer dielectric layer and the second spacer dielectric layer forms the first sidewall dielectric spacers on the sidewalls of the first transistor device control gate 442 and the first transistor device floating gate 422, and on the sidewalls of the second transistor device control gate 444 and the second transistor device floating gate 424, as well as the second sidewall dielectric spacers on the sidewalls of the transistor device erase gate 520 (not shown). The first spacer dielectric layer may be a silicon oxide layer while the second spacer dielectric layer may be a silicon nitride layer. Other types of dielectric materials as well as techniques for forming the sidewall dielectric spacers may also be useful.

A third dielectric layer may be deposited over the substrate to form the ILD barrier layer portions of the first portion transistor device dielectric barrier 460 and the second portion transistor device dielectric barrier 462. For example, the third dielectric layer may be part of an ILD layer. The third dielectric layer fills a gap between the sidewall dielectric spacers to form the ILD barrier layer portions. The ILD barrier layer portions, for example, may be formed by CVD. The ILD barrier layer portions may be formed by depositing a dielectric material such as silicon oxide. Providing other types of dielectric materials such as silicon nitride may also be useful. Excess dielectric material formed by deposition may be removed. For example, the excess dielectric material for forming the ILD barrier layer portions may be planarized by ILD chemical mechanical polishing. Other techniques may also be useful.

As shown in FIG. 7B, the first portion transistor device dielectric barrier 460 and the second portion transistor device dielectric barrier 462 extend between the first transistor device select gate 321 and the second transistor device select gate 331. The transistor device dielectric barrier 460, in one embodiment, at least partially or fully abuts the first transistor device control gate 442 and the transistor device erase gate 520. For example, a first sidewall of the transistor device dielectric barrier 460 at least partially or fully abuts a sidewall of the first transistor device control gate 442, and a second sidewall of the transistor device dielectric barrier 460 at least partially or fully abuts a first sidewall of the transistor device erase gate 520. The first portion transistor device dielectric barrier may have a width $w_{B1}$ ranging from 0.03 um to 0.05 um. For example, the width $w_{B1}$ of the first portion transistor device dielectric barrier 460 compared to a width of the first transistor device select gate may have a ratio ranging from 1:3 to 1:2.

As for the second portion transistor device dielectric barrier 462, it at least partially or fully abuts the second transistor device control gate 444 and the transistor device erase gate 520. For example, a first sidewall of the further transistor device dielectric barrier 462 at least partially or fully abuts a sidewall of the second transistor device control gate 444, and a second sidewall of the further transistor device dielectric barrier 462 at least partially or fully abuts a second sidewall of the transistor device erase gate 520. The second portion transistor device dielectric barrier may have a width $w_{B1}$ ranging from 0.03 um to 0.05 um. For example, the width $w_{B2}$ of the second portion transistor device dielectric barrier 462 compared to a width of the first transistor device select gate may have a ratio ranging from 1:3 to 1:2.

In one embodiment, an implant step may be performed to increase a width of the transistor device first doped region 412 of the transistor device 430. This forms the transistor device 430 such that it has a width wider than the memory device first doped region of a memory device 140 in an adjacent column of the memory array. The implantation forms the transistor device 430 having a transistor device first doped region 412 a width $w_{TS}$ ranging from 0.07 um to 0.12 um. For example, the width $w_{TS}$ of the transistor device first doped region 412 compared to a width of the memory device first doped region may have a ratio ranging from 0.7:1 to 1.2:1.

As shown, the transistor device 430 similar to that described in FIG. 4B is formed in the memory array. For example, the transistor device 430 is formed with narrower first and second transistor device control gates. For example, the transistor device control gates are narrower than the memory device control gates. Providing a transistor device control gate with a narrower width enables smaller couple ratio to the transistor device floating gate. This enhances immunity of the transistor device to programming disturbance. Additionally, the narrower control gate may also increase cell current. Additionally, the transistor device 430 is formed with a transistor device first doped region which is wider than the memory device first doped region. This advantageously decrease SL resistance and increase cell current. The hard mask may then be removed and the process 700 continues to complete formation of the memory array, similar to the process 500 as described in FIG. 5C after forming the transistor device dielectric barrier onwards.

In a non-limiting embodiment, a substrate comprising a memory device may be obtained where the memory device is arranged on or over the substrate. The memory device may include a first memory device select gate and a second memory device select gate. The memory device dielectric layer may at least partially extend from the first memory device select gate to the second memory device select gate.

A transistor device may be arranged or formed on or over the substrate as discussed above. The substrate may further include a transistor device first doped region, a transistor device second doped region, and a transistor device third doped region. A first transistor device select gate may be arranged or formed over a first transistor region between the transistor device first doped region and the transistor device second doped region. A second transistor device select gate may be arranged or formed over a second transistor region between the transistor device first doped region and the transistor device third doped region. A transistor device dielectric barrier may be arranged to at least partially extend between the first transistor device select gate and the second transistor device select gate. The dielectric barrier may have a width compared to the width of the first transistor device select gate and/or the second transistor device select gate that has a ratio ranging from 0.33:1 to 5:1.

In a non-limiting example, the transistor device dielectric barrier may at least partially abut the first transistor device select gate and at least partially abut the second transistor device select gate.

In yet another non-limiting example, a transistor device erase gate may be arranged over the transistor device first doped region. A first portion of the transistor device dielectric barrier may at least partially abut the first transistor device select gate and at least partially abut the transistor device erase gate. A second portion of the transistor device dielectric barrier may at least partially abut the second transistor device select gate and at least partially abut the transistor device erase gate.

In yet another non-limiting example, the transistor device may be arranged on or over the substrate by arranging a dummy memory device on or over the substrate. The dummy memory device may include the first transistor device select gate, the second transistor device select gate, the first portion transistor device dielectric barrier, the transistor device erase gate, the second portion transistor device dielectric barrier, a first transistor device floating gate between the transistor device erase gate and the first transistor device select gate, a second transistor device floating gate between the transistor device erase gate and the second transistor device select gate, a first transistor device control gate over the first transistor device floating gate, and a second transistor device control gate arranged over the second transistor device floating gate. After arranging the dummy memory device on or over the substrate, at least a portion of the first transistor device control gate and/or at least a portion of the second transistor device control gate may be removed therefrom. The first portion transistor device dielectric barrier may at least partially abut the partially removed first transistor device control gate and at least partially abut the transistor device erase gate. The second portion transistor device dielectric barrier may at least partially abut the partially removed second transistor device control gate and at least partially abut the transistor device erase gate.

In yet another non-limiting example, the first transistor device control gate and/or the second transistor device control gate may be fully removed from the dummy memory device. A first portion transistor device dielectric barrier may be arranged to at least partially abut the first transistor device select gate and to at least partially abut the transistor device erase gate and/or a second portion transistor device dielectric barrier may be arranged to at least partially abut the second transistor device select gate and to at least partially abut the transistor device erase gate.

In yet another non-limiting example, the first transistor device floating gate and/or the second transistor device floating gate may be at least partially or fully removed from the dummy memory device, alone or in addition to the partial or full removal of the first and/or second control gates. A first portion transistor device dielectric barrier may be arranged to at least partially abut the first transistor device select gate and at least partially abut the transistor device erase gate and/or a second portion transistor device dielectric barrier may be arranged to at least partially abut the second transistor device select gate and at least partially abut the transistor device erase gate.

The semiconductor devices within the memory arrays may be used as source line (SL) pull down devices capable of having a much larger drive current to efficiently pull down a SL voltage during a read operation. Such devices utilize less area of the memory array, but increase the drive current as compared to conventional devices used in memory arrays.

For example, the transistor devices with at least partially or fully removed/absent control gates, at least partially or fully removed/absent floating gates within the memory array, or combinations thereof within the memory array may be used as source line pull down devices capable of having a much larger drive current to efficiently pull down the SL voltage during a read operation. Further, the transistor devices reduce risk of disturbing one or more programming operations within the memory array. For example, electrons may no longer be trapped in the floating gates when the floating gates are removed (i.e. are absent) from the dummy memory devices to form the transistor devices. This may provide a higher drive current because of a decreased resistance of the transistor device(s). The higher drive current may also allow for a higher voltage by the transistor devices as well as more read margin for high speed applications. Furthermore, the transistor device(s) allow for a higher driver current without an increase in area within the memory array.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory array comprising:
  a memory device arranged on or over a substrate, wherein the memory device comprises a first memory device select gate and a second memory device select gate, a first memory device control gate, a first memory device floating gate, a second memory device control gate and a second memory device floating gate between the first memory device select gate and a second memory device select gate; and
  a transistor device arranged on or over the substrate and adjacent to the memory device; wherein the substrate further comprises a transistor device first doped region, a transistor device second doped region, and a transistor device third doped region; wherein the memory device and the transistor device are coupled to a common source line and the transistor device comprises:
    a first transistor device select gate over a first transistor region between the transistor device first doped region and the transistor device second doped region,
    a second transistor device select gate over a second transistor region between the transistor device first doped region and the transistor device third doped region, and
    wherein a control gate is absent between the first transistor device select gate and the second transistor device select gate, or the transistor device comprises a control gate having a width narrower than a width of the first memory device control gate and/or a width of the second memory device control gate.

2. The memory array of claim 1, further comprising a transistor device dielectric barrier at least partially extending between the first transistor device select gate and the second transistor device select gate, wherein the transistor device dielectric barrier at least partially abuts the first transistor device select gate and at least partially abuts the second transistor device select gate.

3. The memory array of claim 2, wherein the width of the transistor device dielectric barrier ranges from 0.3 um to 0.5 um.

4. The memory array of claim 1, wherein the transistor device further comprises a transistor device erase gate over the transistor device first doped region, and further comprising a transistor device dielectric barrier at least partially extending between the first transistor device select gate and the second transistor device select gate, wherein a first portion of the transistor device dielectric barrier at least partially abuts the first transistor device select gate and at least partially abuts the transistor device erase gate, and wherein a second portion of the transistor device dielectric barrier at least partially abuts the second transistor device select gate and at least partially abuts the transistor device erase gate.

5. The memory array of claim 4, wherein a width of the first portion of the transistor device dielectric barrier ranges from 0.15 um to 0.3 um.

6. The memory array of claim 4,
  wherein the transistor device further comprises a first transistor device floating gate between the transistor device erase gate and the first transistor device select gate, a second transistor device floating gate between the transistor device erase gate and the second transistor device select gate;
  wherein when the control gate is absent, the absence between the first transistor device select gate and the second transistor select gate of the transistor device occurs at one or more of the following locations:
    between the first transistor device select gate and the transistor device erase gate;
    or
    between the second transistor device select gate and the transistor device erase gate; and
    combinations thereof.

7. The memory array of claim 1, wherein the transistor device further lacks a transistor device floating gate between one or more of the following:
  between the first transistor device select gate and the second transistor device select gate within the transistor device;
  between the first transistor device select gate and a transistor device erase gate;
  between the second transistor device select gate and a transistor device erase gate; and
  combinations thereof.

8. The memory array of claim 1, wherein the transistor device further lacks a transistor device erase gate and a transistor device floating gate between the first transistor device select gate and the second transistor device select gate.

9. The memory array of claim 1, wherein when the transistor device comprises a control gate having a width narrower than a width of the first memory device control gate and/or a width of the second memory device control gate, the transistor device further comprises a transistor device erase gate over the transistor device first doped region, a first transistor device floating gate between the transistor device erase gate and the first transistor device select gate, a second transistor device floating gate between the transistor device erase gate and the second transistor device select gate, a first transistor device control gate over the first transistor device floating gate, and a second transistor device control gate over the second transistor device floating gate, and a transistor device dielectric barrier at least partially extending between the first transistor device select gate and the second transistor device select gate; wherein a first portion of the transistor device dielectric barrier at least partially abuts the first transistor device control gate and at least partially abuts the transistor device erase gate, and wherein a second portion of the transistor device dielectric barrier at least partially abuts the second transistor device control gate and at least partially abuts the transistor device erase gate.

10. The memory array of claim 2, wherein the transistor device dielectric barrier comprises a silicon oxide layer.

11. The memory array of claim 10, wherein the transistor device dielectric barrier further comprises a first silicon oxide spacer layer and a second silicon nitride spacer layer.

12. The memory array of claim 1, wherein
the transistor device are adjacent to a strap region of the memory array, and
the memory device is arranged at an adjacent column to the transistor device.

13. A method of forming a memory array, comprising:
obtaining a substrate comprising a memory device arranged on or over the substrate; wherein the memory device comprises a first memory device select gate and a second memory device select gate, a first memory device control gate, a first memory device floating gate, a second memory device control gate and a second memory device floating gate between the first memory device select gate and a second memory device select gate;
arranging a transistor device on or over the substrate and adjacent to the memory device; wherein the substrate further comprises a transistor device first doped region, a transistor device second doped region, and a transistor device third doped region; the memory device and the transistor device are coupled to a common source line and wherein arranging the transistor device comprises:
arranging a first transistor device select gate over a first transistor region between the transistor device first doped region and the transistor device second doped region,
arranging a second transistor device select gate over a second transistor region between the transistor device first doped region and the transistor device third doped region, and
wherein a control gate is absent between the first transistor device select gate and the second transistor device select gate, or the transistor device comprises a control gate having a width narrower than a width of the first memory device control gate and/or a width of the second memory device control gate.

14. The method of claim 13, wherein arranging the transistor device further comprises arranging a transistor device dielectric barrier to at least partially extend between the first transistor device select gate and the second transistor device select gate, wherein the transistor device dielectric barrier at least partially abuts the first transistor device select gate and at least partially abuts the second transistor device select gate.

15. The method of claim 13, wherein the arranging the transistor device further comprises:
arranging a transistor device dielectric barrier to at least partially extend between the first transistor device select gate and the second transistor device select gate, and
arranging a transistor device erase gate over the transistor device first doped region, wherein a first portion of the transistor device dielectric barrier at least partially abuts the first transistor device select gate and at least partially abuts the transistor device erase gate, and wherein a second portion of the transistor device dielectric barrier at least partially abuts the second transistor device select gate and at least partially abuts the transistor device erase gate.

16. The method of claim 15, wherein the arranging of the transistor device on or over the substrate comprises arranging the first transistor device select gate, the second transistor device select gate, the transistor device dielectric barrier, the transistor device erase gate, a first transistor device floating gate between the transistor device erase gate and the first transistor device select gate, a second transistor device floating gate between the transistor device erase gate and the second transistor device select gate, a first transistor device control gate over the first transistor device floating gate, and a second transistor device control gate over the second transistor device floating gate; and wherein the method further comprises:
removing at least a portion of the first transistor device control gate and/or at least a portion of the second transistor device control gate; and
arranging a first portion of the transistor device dielectric barrier to at least fill a gap formed by the at least partially removed first transistor device control gate, and/or arranging a second portion of the transistor device dielectric barrier to at least fill a gap formed by the at least partially removed second transistor device control gate.

17. The method of claim 15, wherein the arranging of the transistor device on or over the substrate comprises arranging the first transistor device select gate, the second transistor device select gate, the transistor device dielectric barrier, the transistor device erase gate, a first transistor device floating gate between the transistor device erase gate and the first transistor device select gate, a second transistor device floating gate between the transistor device erase gate and the second transistor device select gate, a first transistor device control gate over the first transistor device floating gate, and a second transistor device control gate over the second transistor device floating gate; and wherein the method further comprises:
fully removing the first transistor device control gate and/or the second transistor device control gate; and
wherein a first portion of the transistor device dielectric barrier is arranged to at least partially abut the first transistor device select gate and to at least partially abut the transistor device erase gate and/or wherein a second portion of the transistor device dielectric barrier is arranged to at least partially abut the second transistor device select gate and to at least partially abut the transistor device erase gate.

18. The method of claim 17, further comprising:
fully removing the first transistor device floating gate and/or the second transistor device floating gate; and
wherein a first portion of the transistor device dielectric barrier is arranged to at least partially abut the first transistor device select gate and at least partially abut the transistor device erase gate and/or wherein a second portion of the transistor device dielectric barrier is arranged to at least partially abut the second transistor device select gate and at least partially abut the transistor device erase gate.

* * * * *